United States Patent [19]
Kato et al.

[11] Patent Number: 5,757,233
[45] Date of Patent: May 26, 1998

[54] COMPLEMENTARY TRANSISTOR CIRCUIT AND AMPLIFIER AND CRT DISPLAY DEVICE USING THE SAME

[75] Inventors: Kazuo Kato, Ibaraki-ken; Hideo Sato; Takashi Sase, both of Hitachi; Kenkichi Yamashita, Katsuta, all of Japan

[73] Assignee: Hitachi, Ltd., Tokyo, Japan

[21] Appl. No.: 483,844

[22] Filed: Jun. 7, 1995

Related U.S. Application Data

[62] Division of Ser. No. 480,673, Feb. 15, 1990.

[30] Foreign Application Priority Data

| Feb. 17, 1989 | [JP] | Japan | 1-36170 |
| May 15, 1989 | [JP] | Japan | 1-118661 |
| May 15, 1989 | [JP] | Japan | 1-118662 |
| May 15, 1989 | [JP] | Japan | 1-118665 |

[51] Int. Cl.[6] .................................................. H03F 3/45
[52] U.S. Cl. ................................... 330/254; 327/359
[58] Field of Search ........................ 330/254, 257, 330/288; 327/356, 359

[56] References Cited

U.S. PATENT DOCUMENTS

| 4,051,521 | 9/1977 | Harwood | 358/30 |
| 4,293,875 | 10/1981 | Katz | 358/184 |
| 4,494,075 | 1/1985 | Yoshihisa | 330/254 |
| 4,516,081 | 5/1985 | Katakura | 330/254 |
| 4,525,683 | 6/1985 | Jason | 330/288 |
| 4,599,574 | 7/1986 | Chambers | 330/254 |
| 4,654,712 | 3/1987 | Gershfeld | 358/65 |
| 4,722,006 | 1/1988 | Kimura et al. | 358/34 |
| 4,755,768 | 7/1988 | Shimokawa | 330/290 |
| 4,929,908 | 5/1990 | Imanishi | 330/254 |

FOREIGN PATENT DOCUMENTS

| 52-61945 | 5/1977 | Japan | 327/356 |
| 61-228778 | 10/1986 | Japan . | |

OTHER PUBLICATIONS

Novel Design Manual for Low–Frequency and High–Frequency Circuits:, CQ Publishing Co., 1st Ed., Apr. 30, 1988, pp. 258–259.

1989 IEEE International Solid–State Circuits Conference, Digest of Technical Papers, pp. 70–71.

IEEE Transactions on Consumer Electronics, vol. 34, No. 3, Aug. 1988, pp. 426–433.

*Primary Examiner*—Steven Mottola
*Attorney, Agent, or Firm*—Antonelli, Terry, Stout, & Kraus, LLP

[57] ABSTRACT

The present invention relates to a complementary transistor circuit and, an amplifier using it, and in particular, to a video amplifier for amplifying video signals and a high-definition CRT display device. In amplifying inputted video signals by using a multiplexer, a gain controller and a current mirror amplifier, each element circuit is formed by using complementary transistor circuits. Circuit simplification is thus attained. In addition, higher precision and band broadening has been realized owing to adoption of a current operation. Further, the present invention makes it possible to eliminate direct from the high voltage output completely by providing a low-voltage output circuit for feedback having a similar relationship with respect to the high-voltage video output stage of the video amplifier, thereby performing negative feedback via a sample-and-hold circuit. This also serves to broaden the bandwidth and reduce power dissipation.

14 Claims, 24 Drawing Sheets

| FIG. 3A | FIG. 3B |

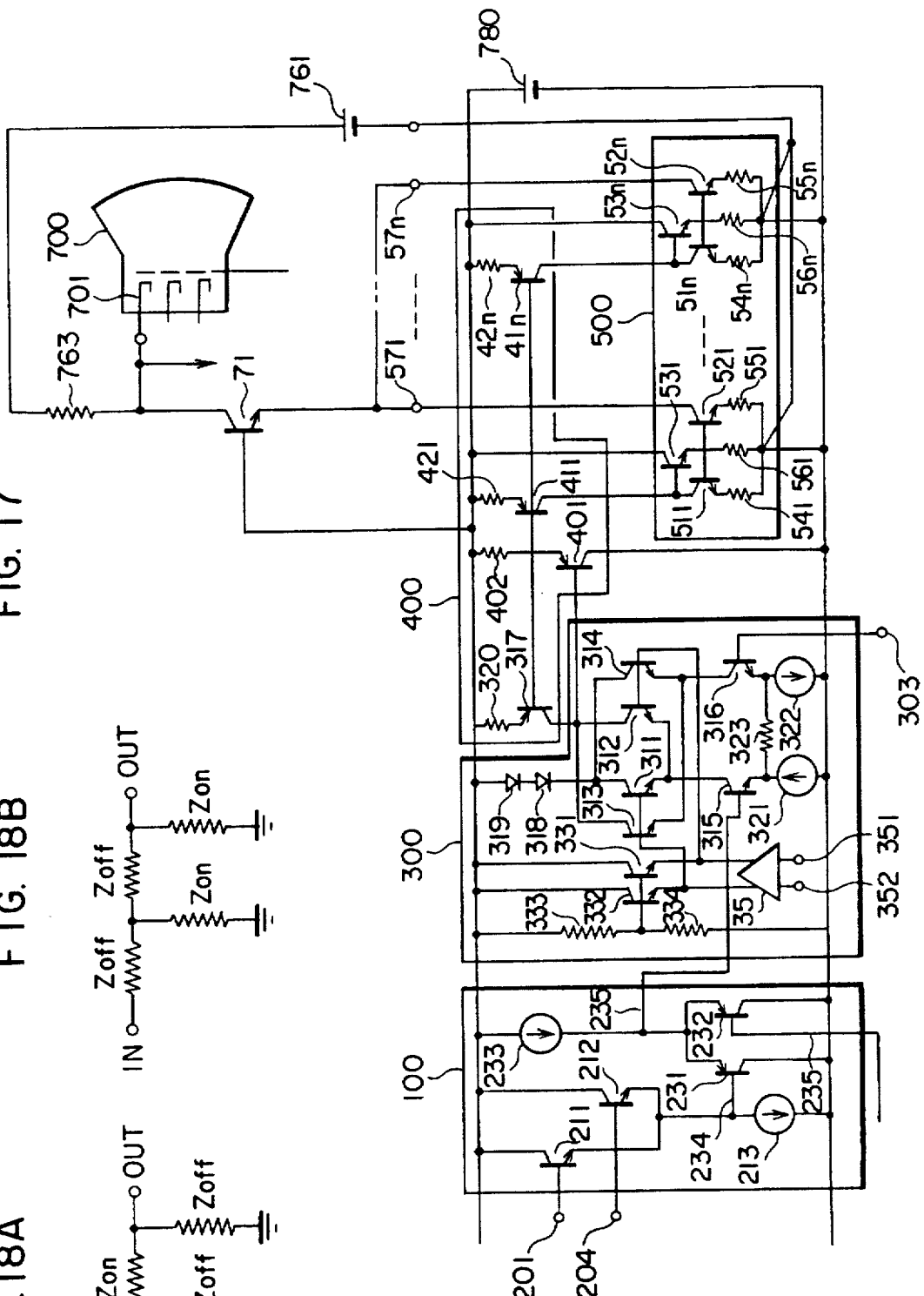

F I G. 21A
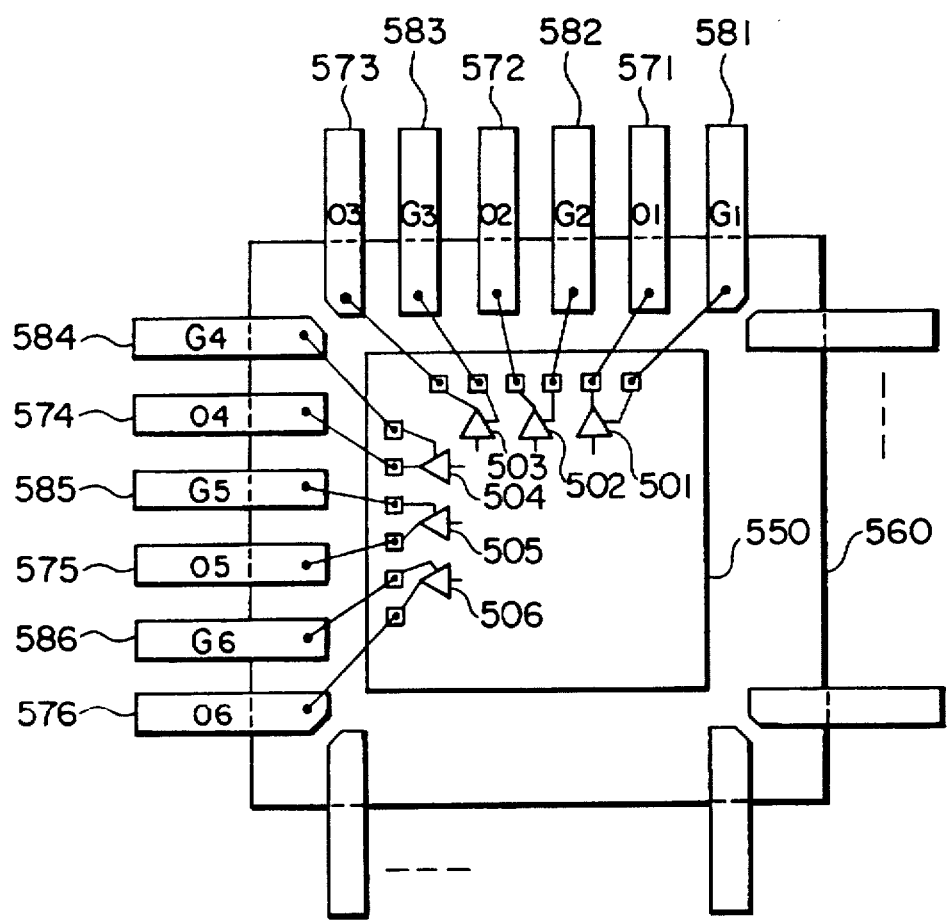

F I G. 22
F I G. 23
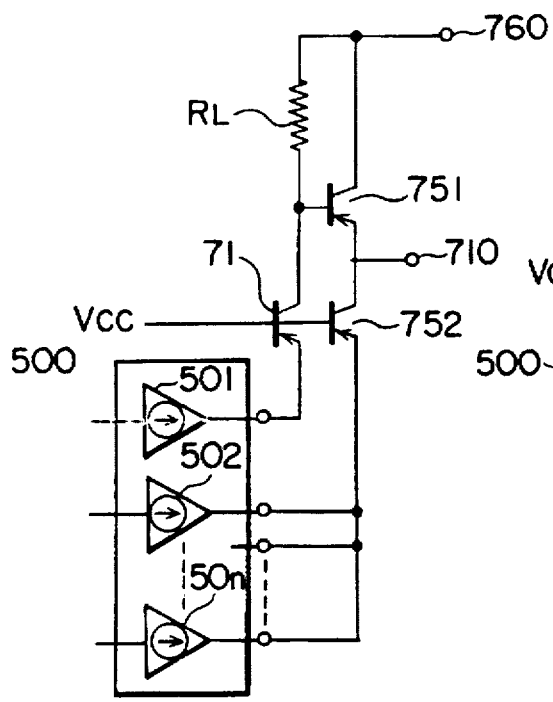
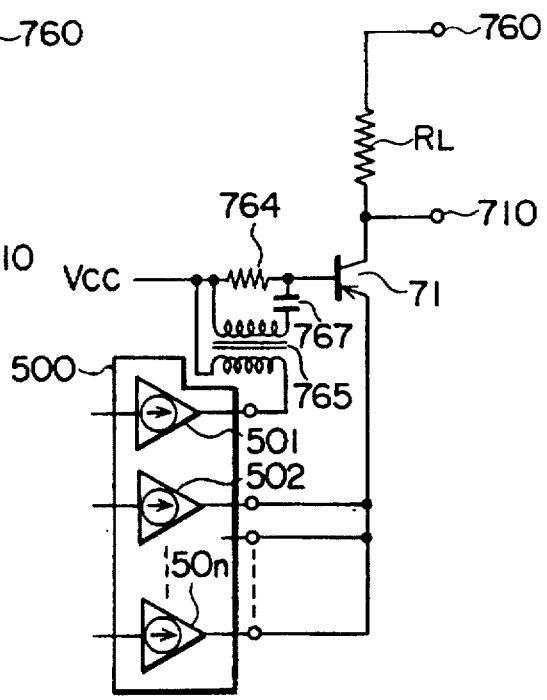
F I G. 24
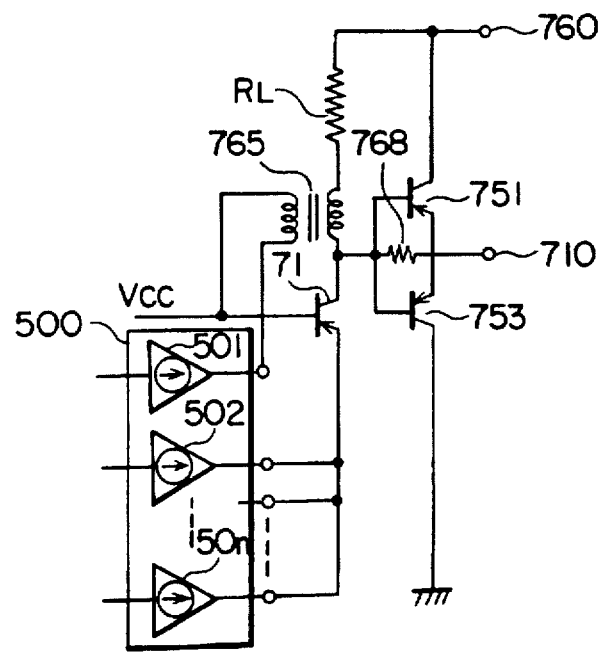

COMPLEMENTARY TRANSISTOR CIRCUIT AND AMPLIFIER AND CRT DISPLAY DEVICE USING THE SAME

This is a divisional of commonly assigned and now allowed U.S. application Ser. No. 480,673, filed Feb. 15, 1990.

BACKGROUND OF THE INVENTION

The present invention relates to a complementary transistor circuit, and an amplifier (especially a video amplifier for amplifying video signals) and a CRT display device using such a complementary transistor circuit. In particular, the present invention provides an element circuit and a system suitable for a CRT display device having higher definition and dissipating lower power.

High definition CRT display devices known as so-called CRT display devices for computers are required to have higher definition, such as 2M or 4M pixels, instead of currently prevailing representations with 1M pixels. As a result, video amplifier systems are required to have increasingly wider passbands such as 150 MHz or 300 MHz instead of 100 MHz. Further, since the output needs a large amplitude such as 40 to 50 Vpp and a direct current (DC) bias level amounting to 100 V, higher precision and lower power dissipation are also demanded.

A video amplifier, which is one of principal intended uses of the present invention, is described in, for example, JP-A-61-228778 entitled "Amplifier circuit" by inventors including some of the present inventors, and is disclosed a high-voltage cascade amplifier driven by a monolithic stage having functions such as functions of a video multiplexer, a gain controller and a current amplifier.

Further, in a circuit described in U.S. Pat. No. 4,494,075, one of current mirror circuits having opposing polarities located on the load side of a multiplier is formed as a Darlington circuit, and $V_{BE}$ of the current mirror circuit changes according to a change in signal current so as to prevent the occurrence of distortion. In a video amplifier described in U.S. Pat. No. 4,293,875, the cathode of a CRT is driven by a complementary transistor push-pull circuit using a bias circuit subject to level shift. Also, in a video amplifier for composite signals described in U.S. Pat. No. 4,051,521, a high-voltage cascade amplifier is driven by a low-voltage complementary emitter follower amplifier. Further, in a circuit described in "Novel design manual for low-frequency and high-frequency circuits published by CQ publication company (the first edition of which is published on Apr. 30, 1988), pp. 258–259, a complementary transistor circuit is used as a differential analog switch.

Relatively recent research results pertaining to a wideband video amplifier of a high definition CRT display device are discussed in the 1989 IEEE International Solid-State Circuits Conference Digest of Technical Papers, pp. 70–71 (February 1989) as a type in which high-frequency output stage feedback is performed with high precision.

A cascade form in which high-frequency feedback from the high-frequency output stage is not performed is disclosed in IEEE Transactions on Consumer Electronics, Vol. 34, No. 3, August 1988, pp. 426–433.

SUMMARY OF THE INVENTION

The prior art described in JP-A-61-228778 functions well as a video amplifier. However, simplification of respective function circuits and reduction in the number of amplifier stages are not satisfactorily considered in this prior art arrangement. This results in problems that the circuit configuration becomes complicated and it becomes difficult to cope with wider operation frequency bands in the future. Further, in the aforementioned three U.S. Patents and literature such as that of a differential analog switch, elementary techniques such as the complementary transistor circuit are respectively described. Unlike the present invention, however, simplification by extensively using complementary transistor circuits in the gain controller of the video amplifier, the current mirror circuit at the output stage, and the like is not mentioned at all.

Further, in the high-frequency negative feedback systems among the above described conventional techniques, the gain margin and the phase margin become insufficient at high frequencies because of delay of the open loop included in the circuit. This leads to instability phenomenon such as oscillation. Further, since the negative feedback loop itself from the high-voltage output stage becomes a load of the amplifier and dissipates high-frequency power, wideoperation is limited.

In the cascade amplifying system included in the above described conventional techniques, the negative feedback path of a high-frequency signal from the output stage can be omitted by maintaining the signal current of the cascade stage with high precision. Since the above described problem of instability caused by high-frequency feedback can thus be avoided, a wider bandwidth can be obtained. In the cascade system as well, however, the DC restorating negative feedback for generating reference DC voltage at the amplifier output so as to correspond to the back porch point of the video signal cannot be omitted. Therefore, the feedback path connected to the high-voltage wideband output stage still remains as the load, broadening the bandwidth and lowering the power dissipation being limited. This is because the high-precision resistor for feedback connected to the high-voltage output stage becomes large in size because it must widthstand relatively large dissipated power, and power dissipated by its parasitic capacitance is large (the power is proportionate to $\Delta cV^2f$). Further, since the capacitance (having a value of, say, 4 to 6 pF) of the cathode load of the high-definition CRT tends to become smaller year after year as a result of technical advances, this parasitic load (having a value of, say, 1 to 2 pF) has an increased proportion.

An object of the present invention is to provide a complementary transistor circuit simplifying the circuit configuration and an amplifier using such a complementary transistor circuit.

Another object of the present invention is to provide a video amplifier and a display device having a wide bandwidth and dissipating low power.

A further object of the present invention is to provide a small-sized, economical and highly reliable video amplifier, and display device.

For attaining a wider bandwidth and lower power dissipation, complementary transistor circuits are adopted, principally high-frequency circuits which are integrated, and circuits are designed for current operation as far as possible together with circuit simplification. Further, wideband circuits are so configured that the high-frequency gain and the DC bias component may be adjusted without interference. Also, a circuit package method is adopted in which a wideband signal can be taken out without degrading the bandwidth.

Further, in accordance with the present invention, the feedback path from the high-voltage wideband video output stage is entirely removed by using a novel low-voltage, high-precision feedback method.

That is to say, the circuit of the low-voltage side of the cascade amplifier comprises a monolithic integrated circuit (hereafter referred to as LSI), and the circuit is a circuit of current operation type formed by complementary transistor circuits comprising high-speed NPN transistors and PNP transistors. Even if complementary bipolar transistor circuits are connected for multiple stages, level shift circuits are not required, resulting in a simple, high-speed, high-precision circuit. Since in the circuit of current operation type the voltage amplitude of the circuit caused by a signal change is small, the influence of charging or discharging of the stray capacitors of the circuit is slight, resulting in a wide bandwidth, low power dissipation and a small-sized circuit. Further, since the circuit is that of constant current operation type, signal addition and branching become easy, and the gain and DC bias of the high-frequency circuit can be freely adjusted without mutual interference. As a result of these features, wide bandwidth and high precision can be realized at the same time.

Further, in accordance with the present invention, the current output stages in the LSI form are pulled out to outside in parallel so that equal adjacent currents may flow in opposite directions. Between adjacent currents, therefore, mutual induction in canceling directions is caused. As a result, equivalent lead inductance of the current pull-out section is reduced. Signals can thus be pulled out without bandwidth degradation.

Further, in the indirect feedback system, which is a primary feature of the present invention, a low-voltage output circuit for feedback having a similar relationship with respect to the high-voltage output stage is disposed in the cascade amplifying stage and a signal equivalent to the output is indirectly fed back. Thereby, direct feedback from the high-voltage output stage is entirely omitted, and hence the load of the high-voltage output stage is lightened, wide bandwidth and low power dissipation being thus realized.

BRIEF DESCRIPTION OF THE DRAWINGS

FIG. 17 is a circuit diagram showing another embodiment of the present invention;

FIGS. 18A and 18B are diagrams showing equivalent circuits of a multiplexer shown in FIG. 17;

FIGS. 21A and 21B are diagrams showing terminals of an IC in an embodiment of the present invention;

FIGS. 22 to 24 are circuit diagrams showing the configuration of a cascade amplifier according to the present invention;

DESCRIPTION OF THE PREFERRED EMBODIMENTS

Figure 1:
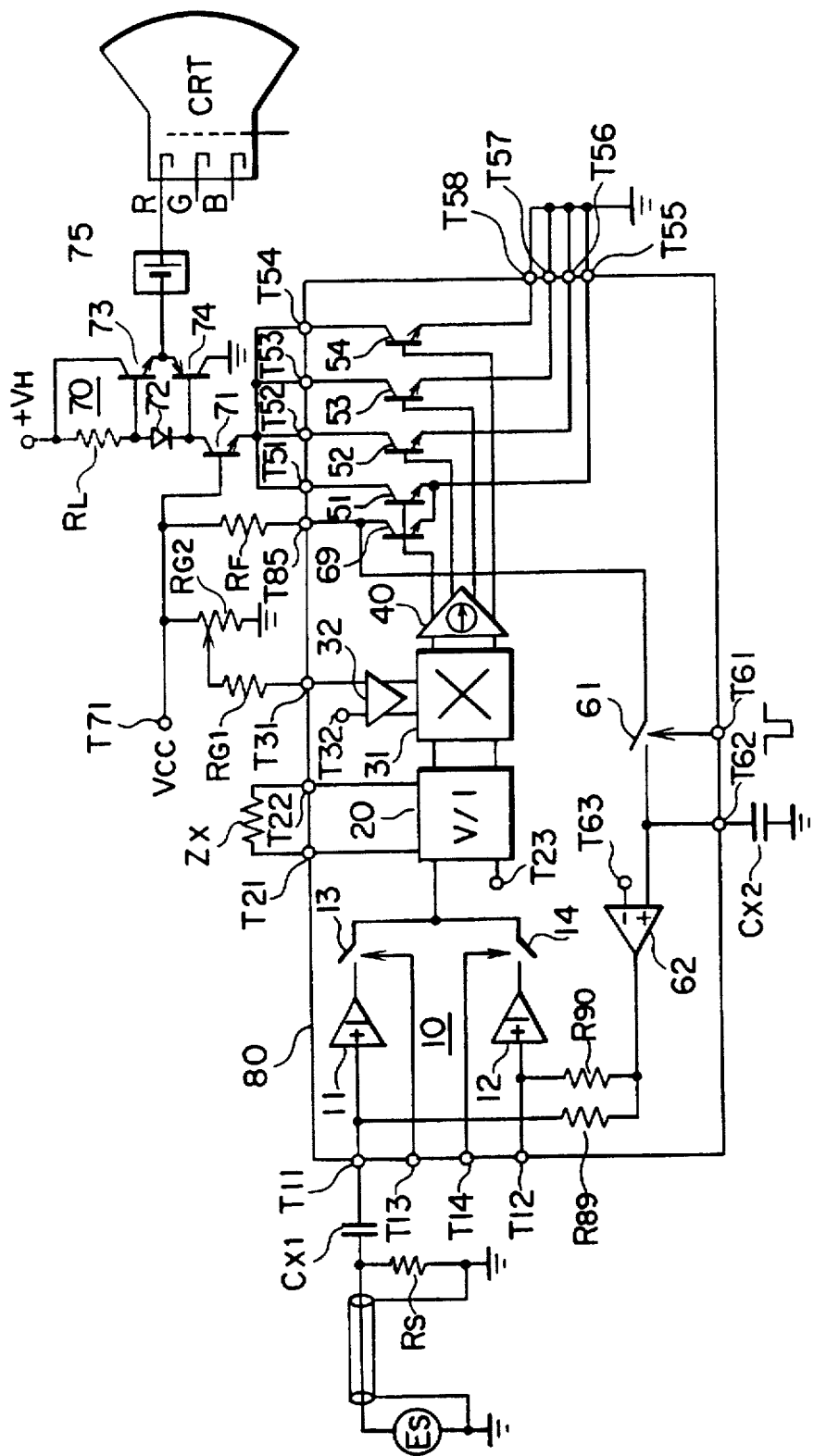
FIG. 1 is a circuit block diagram showing an embodiment of the present invention.

An embodiment of the present invention will hereafter be described by referring to FIG. 1. The scheme of the circuit as a whole will first be described, and then variants of the detailed circuits will be described.

FIG. 1 shows a circuit block diagram of a circuit including a video amplifier of indirect feedback type according to the present invention and a CRT display device using the video amplifier.

The video amplifier shown in FIG. 1 comprises a low-voltage drive stage 80 including an LSI circuit of complementary bipolar transistors and a high-voltage amplifier output stage 70. The drive stage 80 and the high-voltage output stage 70 are so connected as to form a cascade amplifier.

An analog video signal from a signal source $E_S$ is supplied to the input of the low-voltage drive LSI 80 via a terminating resistor $R_S$ having a value of 75 ohms and a coupling capacitor $C_{x1}$ having a large capacitance value. The output of the high-voltage output stage 70 is connected to the cathode electrode of the CRT via a bias voltage source 75 for brightness control. A video signal applied to an input terminal T11 of the drive stage LSI 80 is amplified to drive the cathode electrode of the CRT. The applied signal is thus displayed on the CRT.

The drive stage LSI 80 comprises an LSI of complementary bipolar transistors. The LSI comprises a multiplexer 10 having a 2-input buffer and located at the input stage, a V/I converter circuit 20 having a conversion impedance $Z_x$ and connected to the output side of the multiplexer 10, and a gain controller 31 using the multiplying function and so connected as to succeed the V/I converter circuit. The gain controller 31 is supplied with control voltage from a resistor $R_{G2}$ via a control circuit 32 and a resistor $R_{G1}$.

The gain controller 31 has two current outputs which are opposite to each other in phase. These outputs undergo subtraction in an auxiliary current mirror amplifier 40 to drive current mirror amplifiers 51 to 54 of the output stage.

A current mirror amplifier 69 for feedback is connected to 5 V power supply $V_{cc}$ via an external resistor $R_F$. In addition, the output of the current mirror amplifier 69 is so connected that the output may be negatively fed back to the input via a transfer switch 61, a capacitor $C_{X2}$, an amplifier 62 and resistors R89 and R90.

Outputs of the current mirror amplifiers 51 to 54 of the output stage are connected together to the cascade high-voltage output stage 70. The high-voltage output stage 70 includes a cascade circuit comprising a high-voltage power transistor 71, a diode 72 and a load resistor $R_L$, and a buffer amplifier comprising transistors 73 and 74.

The video amplifier thus configured is an inverting amplifier having a gain of 100 or more and outputting a high-voltage output. The gain between the input of the video amplifier and the output thereof can be represented by the relation $$V_o = K \cdot \frac{R_L}{Z_X} Vi \qquad (1)$$

where $Z_X$ is external impedance of the V/I conversion section, $R_L$ load resistance of the high-voltage output stage of the cascade, and K the gain of the video LSI changed by the control voltage of the gain controller.

Figure 2A:
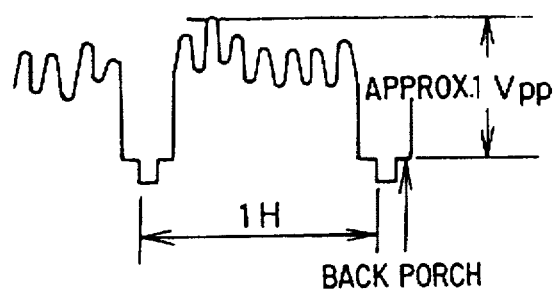
FIGS. 2A and 2B are diagrams showing input and output waveforms of a video signal.
Figure 2B:
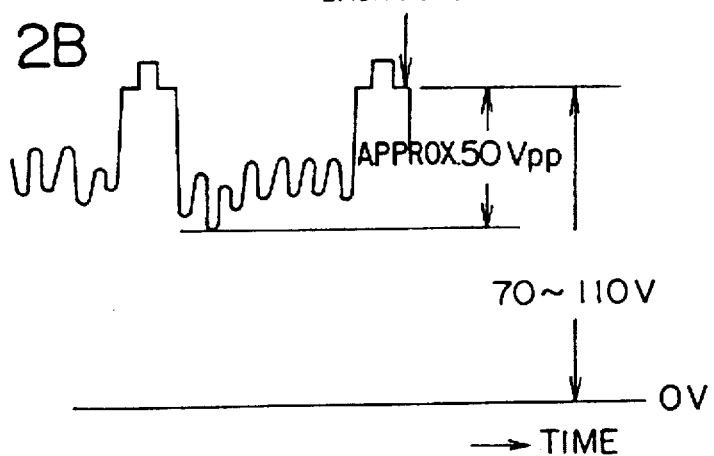

As shown in FIGS. 2A and 2B, the video input signal is supplied as an AC signal having the maximum value close to 1 $V_{pp}$, whereas the output signal for controlling the cathode of the CRT must be supplied as a DC signal with a predetermined high DC voltage added. Therefore, a stable and accurate DC component must be reproduced. In waveforms shown in FIGS. 2A and 2B, this reference DC level is obtained at a time indicated as the "back porch" after a horizontal synchronizing pulse. Operation of the circuit shown in FIG. 1 according to the present invention is performed as follows.

If a periodic sampling pulse at the time of the back porch is applied to a sampling control terminal T61 of the sample-and-hold switch 61 shown in FIG. 1, feedback voltage fed from the current mirror circuit 69 for feedback charges the capacitor $C_{X2}$ of the hold circuit via the switch 61 and is fed back to the input via the amplifier 62 and the bias resistor R89. The open-loop DC gain of this feedback loop has a value of several hundreds. Since this feedback is negative feedback whereby the voltage drop across the external resistor $R_F$ of the positive-phase current mirror 69 is fed back, the amplifier settles down to a constant value when a sufficiently longer time than the time constant of $C_{X1} \cdot R89$ of the input stage has elapsed. Assuming now that the current of the current mirror of the output stage at this time is $I_o$ and the current of the current mirror for feedback is $I_o/N$, DC voltage $V_o$ of the high-voltage output stage, feedback voltage $V_F$ from the current mirror for feedback, power supply voltage $V_H$ of the high-voltage stage and power supply voltage $V_{cc}$ of the low-voltage stage satisfy the following relations.

$$\left. \begin{array}{l} V_o = V_H - I_o R_L \\ V_F = V_{cc} - \dfrac{I_o R_F}{N} \end{array} \right\} \qquad (2)$$

Eliminating $I_o$, we get the following relation.

$$\frac{V_H - V_o}{V_{cc} - V_F} = \frac{N R_L}{R_F} \qquad (3)$$

That is to say, equation (2) indicates that $V_o$ is accurately defined by feeding back the low-voltage $V_F$ without feeding back $V_o$ of the high-voltage output stage. $V_o$ can be concretely set by changing $R_F$ so as to attain the desired $V_o$ or by changing $V_F$ (by means of voltage at a reference terminal T63 of the amplifier 62). This feedback is indirect feedback performed by generating a feedback current similar to the output current. Since the ratio N obtained when a current mirror circuit is used depends upon the emitter dimension ratio of transistors, stability is obtained irrespective of whether the current $I_o$ is large or small. As a result, high-precision control of output voltage is possible.

In this way, impedance elements for feedback are not required at all in the high-voltage output stage. Power dissipation ($\Delta c V^2 f$) caused by parasitic capacitance corresponding to those impedance elements is also eliminated. Wideband operation with low power dissipation thus becomes possible. Further, because the feedback has a low-voltage amplitude, response of the feedback is rapid, and advantages are obtained in the aspects of size reduction and reliability, as well.

Figures 3, 3A:
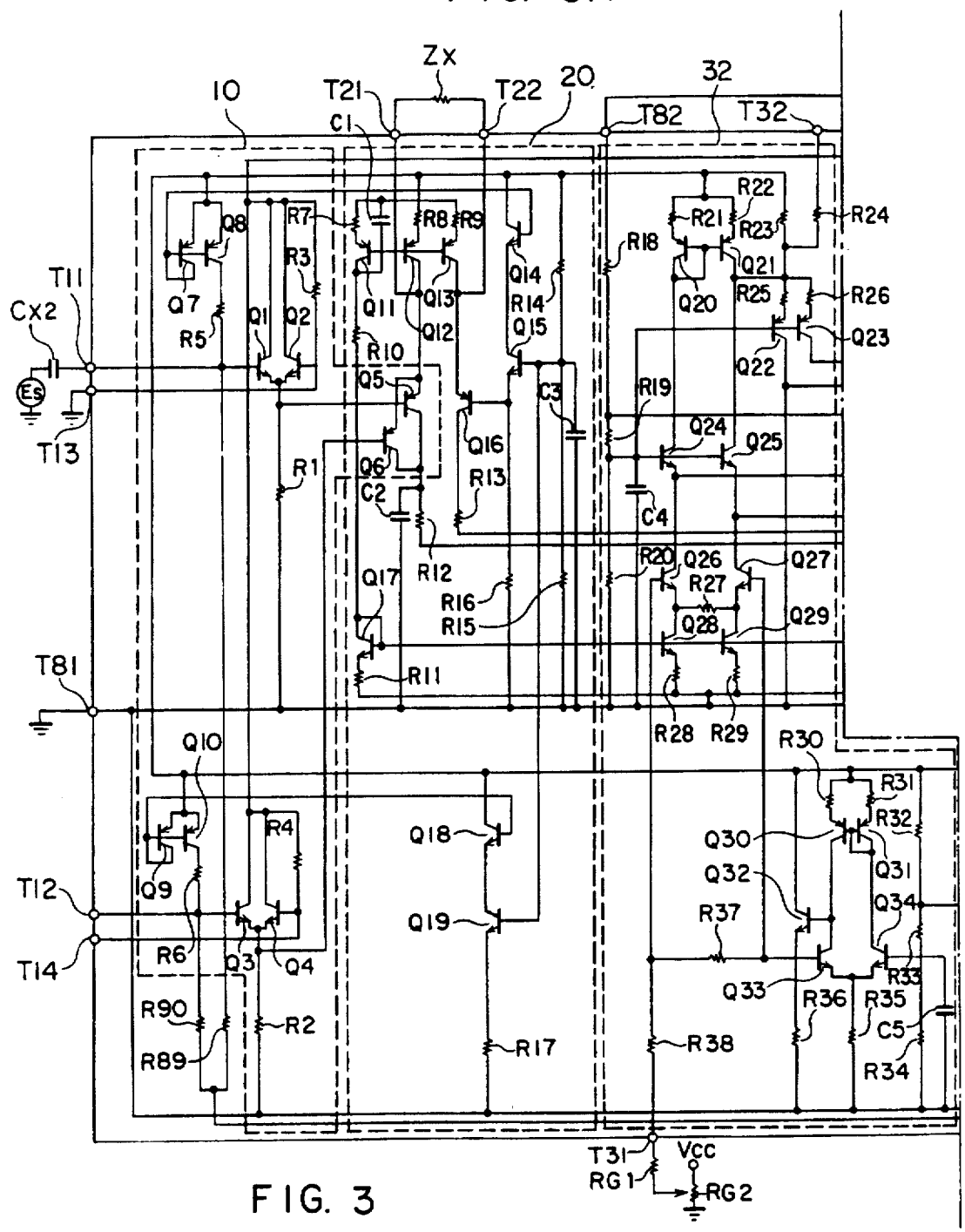
FIGS. 3A and 3B are detailed circuit diagrams showing an embodiment of the present invention.
Figure 3B:
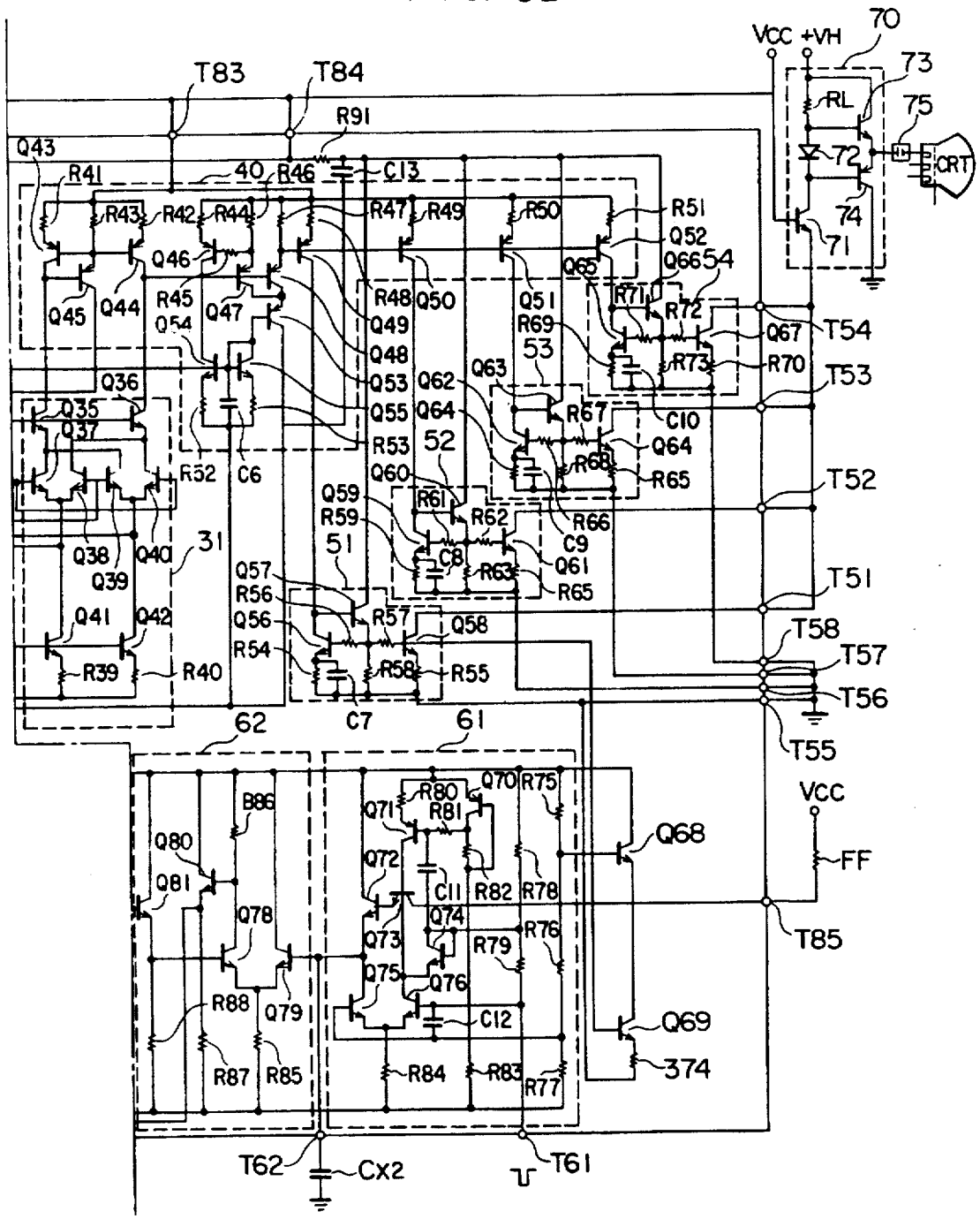

Other embodiments of the present invention will now be described by referring to more detailed circuit diagrams of these embodiments. FIG. 3 is a circuit diagram of a more detailed embodiment corresponding to FIG. 1 which has already been described. Identical portions or equivalent portions are denoted by like characters.

In a high-speed, high-precision feedback circuit, a similar contrivance is needed in the sample-and-hold circuit as well. The sample switch section 61 of FIG. 3 comprises a combination of an analog switch having higher precision and a charging switch operating at a higher speed and having low output impedance. The base of a transistor Q73 serving as an analog switch of the sample switch section 61 is connected to a constant current circuit comprising a pair of transistors Q70 and Q71 and is also connected to one transistor Q76 of a differential transistor pair. The collector of the transistor Q73 is connected to the collector of a current mirror transistor Q69 for feedback, which is in turn connected to the power supply $V_{cc}$ via a resistor $R_F$. The emitter of Q73 is connected to the hold capacitor $C_{X2}$ via an emitter-follower transistor Q72. The current of Q71 of the above described constant current circuit is set at approximately 10 μA so that the offset voltage of the switch transistor Q73 may be minimized. At the time of a drive operation, a capacitor C11 for speed-up is also connected to add a differential current up to 300 μA so as to attain settlement in a minimum sample time (approximately 50 ns in the embodiment). The other transistor Q75 of the differential pair serving as the pulse current bias source is connected to the emitter of the transistor Q72.

Operation of the sample switch section 61 connected as heretofore described will now be described. In the normal state, Q76 of the transistor pair is on and Q75 is off. Therefore, both the transistor Q73 and the transistor Q72 are off. If a sample signal of "L" level is applied to the sample control terminal T61, the transistor Q76 of the differential pair turns off and the transistor Q75 of the differential pair turns on. Therefore, Q73 is driven in a differential manner and Q73 turns on. In addition, a pulse current is permitted to flow through Q72 to lower the emitter output impedance of Q72, resulting in rapid sampling. In the latter half of the sampling interval, the inverse base-collector current of Q73 reaches the normal value (i.e., approximately 10 μA) whereas Q73 exhibits the minimum offset voltage. Low offset of the switch and high-speed sampling thus coexist.

The terminal voltage of the hold capacitor $C_{X2}$ is fed back to the input side of the video amplifier via a differential amplifier comprising transistors Q78, Q79 and Q80. Since the precision of the sample-and-hold circuit must be administered by considering the sampling switch section 61 and the hold amplifier 62 collectively, design is executed so that the current flowing through the transistor Q72 may be equivalent to the current flowing through a transistor Q81 as far as possible to match $V_{BE}$ of Q72 to $V_{BE}$ of Q81. Therefore, precision 1 mV of this sample-and-hold circuit and minimum sampling time of 50 ns are obtained.

One of features of the present invention is circuit simplification and performance improvement owing to complementary bipolar transistor circuits. An embodiment of the multiplexer 10 with a 2-input buffer serving also as a part of the V/I converter circuit will hereafter be described. The multiplexer 10 with the 2-input buffer shown in FIG. 3 comprises three differential transistor pair circuits, i.e., a transistor pair Q1 and Q2, a transistor pair Q3 and Q4, and a transistor pair Q5 and Q6. Among these, the pair Q1 and Q2 and the pair Q3 and Q4 are input switches and comprise NPN transistors, whereas the pair Q5 and Q6 comprise PNP transistors of opposite polarities and also serve as a part of the V/I converter circuit. The Q1–Q2 pair and the Q3–Q4 pair are biased by emitter resistors R1 and R2, respectively. The Q5–Q6 pair serving also as the V/I converter is biased by a constant current circuit comprising a transistor Q12. Each bias current is so defined that the cutoff frequency $f_T$ of each transistor may become high and complementariness may be attained, i.e., the change rate of base-emitter voltage of the NPN transistor at the operation point may become equivalent to that of the PNP transistor. For example, each bias current is set at approximately 1 mA. As for the input transistor pair Q1 and Q2, the base of Q1 is connected to the signal input terminal T11, whereas the base of Q2 is biased to $V_{cc}$ by a resistor R3 and is connected to a control terminal T13. The output of the common emitter is connected to the base of Q5 of the PNP transistor pair. In the same way, the base of Q3 in the Q3–Q4 pair is connected to an input terminal T12, whereas the base of Q4 is connected to a control terminal T14. The common emitter is connected to the base of Q6 in the V/I conversion transistor pair.

Figure 4A:
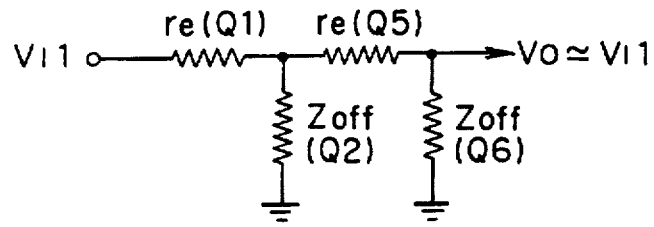
FIGS. 4A and 4B are diagrams showing equivalent circuits of a multiplexer.
Figure 4B:
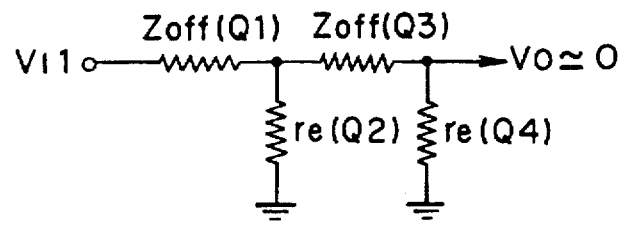

Operation of this circuit will now be described. The control input terminal T13 is set at its "L" level and the terminal T14 is set at its "H" level so that the input signal fed through the terminal T11 may be selected and the signal fed through the terminal T12 may not be selected. As a result, Q2 in the transistor pair Q1–Q2 turns off and Q1 serves as an emitter follower to transmit the input signal to Q5. In the transistor pair Q3–Q4, only Q4 having higher base voltage becomes conductive, and its emitter voltage is inputted to Q6. In the PNP transistor pair Q5–Q6, therefore, only Q5 having relatively low base voltage becomes conductive. Eventually, the signal at the input terminal T11 is selected as the V/I conversion signal. In order to select the terminal T12 side and in order not to select the terminal T11 side, the above described operation has inverted relations. Assuming that the input signal at the terminal T11 is VI1 and the voltage of the common emitter of the transistor pair Q5–Q6 serving also as the V/I converter is $V_o$ equivalent circuit of the above described circuit obtained at the time of selection and at the time of nonselection with the exception of load effect caused by $Z_x$ are shown in FIGS. 4A and 4B, respectively. That is to say, equivalent circuits are represented as two-stage series-parallel switches, where $r_e$ is the emitter resistance of the transistor and extremely small (approximately 26 ohms at 1 mA). $Z_{off}$ is parasitic impedance between the base and emitter reverse biased. Therefore, the on-off ratio of the two-stage switch is extremely large and is 50 dB or more as far as several tens MHz. Further, since the circuit functions as an emitter follower during the on time, the signal attenuation which is as small as 1% or less as far as several 100 Hz becomes possible.

Further, the multiplexer 10 with buffer according to the present invention comprises only two stages of emitter followers and also serves substantially as the V/I converter, resulting in extremely wideband operation.

Two current mirror circuits respectively comprising PNP transistors Q7 and Q8 and PNP transistors Q9 and Q10 are provided for compensating the input current of the multiplexer 10. Conjointly with the fact that the multiplexer is an emitter follower input type, this compensation always maintains high input impedance and makes the low-pass characteristics of the video amplifier stable.

The multiplexer 10 with buffer of the present invention heretofore described is a concrete example in which circuit simplification and performance enhancement are realized by the complementary bipolar transistor circuit scheme which is one of principal means of the present invention.

An embodiment in the V/I converter circuit section 20 shown in FIG. 3 will now be described. One of principal means for attaining wideband of a video amplifier in accordance with the present invention is to adopt current operation in the circuit as far as possible. Therefore, the video input signal of voltage is rapidly converted into a current signal at a stage where the signal-to-noise ratio has not yet significantly degraded. The V/I converter circuit 20 is a differential circuit comprising a new PNP transistor Q16 in addition to the PNP transistors Q5 and Q6 which also serve as the output stage of the above described multiplexer. Their respective emitters are supplied with bias currents respectively from PNP transistors Q12 and Q13 forming current Millers and are connected to conversion impedance $Z_x$ for defining the conversion gain of V/I conversion. The transistor Q16 side provides a reference for defining the center of the operation range. The base of the transistor Q16 is supplied with reference voltage by a voltage divider circuit comprising resistors R14 and R15 via an emitter follower Q15. Since the signal input of the video amplifier is an AC input, this reference voltage need not be strictly accurate. In order to make the maximum allowed input of the circuit large, the reference voltage is so set as to be nearly half of the power supply $V_{cc}$. The operation current of the transistor $Q_{16}$ is set at a value nearly equivalent to that of the operation current of the multiplexer so that the above described reference and the input terminals T11 and T13 of the multiplexer 10 may have equivalent amounts of level shift and may have equivalent offsets with respect to a temperature change.

In this V/I converter circuit, the input signal selected by the multiplexer is conveyed to the common emitter of Q5 and Q6, and the difference voltage ($\Delta V$) between the voltage of the common emitter of Q5 and Q6 and the emitter voltage of Q16 is converted into a current ($\Delta I = \Delta V/Z_x$) by means of the V/I conversion impedance. The collector current of the transistors Q5 and Q6 and the collector current of the transistor Q15 become signals changing in the form of I±AI. The conversion impedance $Z_x$ may typically comprise only a resistor. In case the frequency characteristics of V/I conversion are positively changed, however, a capacitor or an inductor is used together with the resistor.

This V/I converter circuit is a balanced circuit. Since the input signal is a single-ended input signal, however, frequency responses of the differential output circuit in a high-frequency region do not generally become identical. In the embodiment of the present invention, resistors R12 and R13 and a capacitor C2 are inserted into the output side to match frequency response characteristics.

The video gain controller of current output type will now be described. With reference to FIG. 3, the gain controller 31 comprises a so-called multiplier circuit of variable conductance type including a differential stage formed by cross-coupling collectors of NPN transistors Q37 to Q40, a cascade amplifier circuit comprising NPN transistors Q35 and Q36, and a bias circuit comprising NPN transistors Q41 and Q42 and resistors R39 and R40. Further, the control circuit 32 includes a voltage-current converter circuit comprising NPN transistors Q26–Q29 and resistors R27–R29, a linearizing logarithm bias circuit comprising common-base NPN transistors Q24 and Q25, a control voltage divider circuit comprising transistors Q30–Q34 and resistors R30–R38, and a variable bias current generation circuit comprising PNP transistors Q43 to Q45 and resistors R21 to R26.

The basic principle of this configuration is discussed in detail as a quadruple quadrant multiplier in "Analog integrated circuit" written by Gleben, translated by Nakazawa et al., and published by Kindai Kagakusha, (September 1984), pp. 234–242. The video gain controller shown in FIG. 3 is different from this basic configuration in that the above described cascade amplifier circuit comprising Q35 and Q36, the above described control voltage divider circuit, and the above described variable bias current generation circuit are added. The above described cascade amplifier connected to the output of the above described variable conductance multiplier lowers the load impedance of this multiplier circuit to improve the passband.

Further, the above described control voltage divider circuit divides the voltage supplied at a gain control terminal T31 by using resistors R37 and R38 and supplies the resulting voltage to the base of Q26, which is one input of the above described voltage-current converter circuit. In addition, reference voltage generated by R32–R34 is supplied to the base of Q27, which is the other input of the above described voltage-current converter circuit, via a buffer amplifier comprising transistors Q30–Q34 and resistors R30, R31, R35 and R36. Owing to such configuration, the base point of Q27, which is the other input of the above described voltage-current converter circuit, has low impedance. The change in reference voltage caused by the current of the divider resistor R27 is thus largely reduced, and the gain can be controlled with high precision. Further, since the voltage at the gain control terminal T31 is divided and supplied to the above described voltage-current converter circuit, the power supply voltage required for the above described voltage-current converter circuit can be lowered and the drive LSI 80 can be driven by a low-voltage power supply (such as a single 5-V power supply).

Subsequently, the variable bias current generation circuit will now be described. This is a circuit for correcting the brightness level changed by the contrast gain. With reference to FIG. 3, the output current difference $I_{OG}$ of the above described gain controller 31 is represented as $$I_{OG} = K_G \cdot \frac{V_i - V_{R1}}{Z_x} \quad (4)$$

where $K_G$ is the gain of the gain controller 31, $Z_x$ conversion impedance, and $V_{R1}$ the reference voltage of the voltage-current converter circuit. In general, $V_i$ changes in the range of $V_{R1} \pm \Delta V$, and the brightness level is set at $V_{R1} - \Delta V$. At this time, $I_{OG}$ becomes $-K_G \cdot \Delta V / Z_x$, and changes in proportion to the gain $K_G$. The present bias current generation circuit is so configured as to generate a current having a polarity opposite to that of this current change. That is to say, a current Miller circuit comprising transistors Q20 and Q21 and resistors R21 and R22 detects the current difference of the above described voltage-current converter circuit and generates a current proportionate to the gain $K_G$. This current gain is so adjusted in a current branching circuit comprising transistors Q22 and Q23 and resistors R25 and R26 as to be equivalent to the output current change of the gain controller 31.

Owing to the configuration heretofore described, the output of the present bias current generation circuit can be made equal in magnitude and opposite in polarity with respect to the change in brightness level caused by a gain change. By adding this output current in the auxiliary current mirror amplifier 40, therefore, the change in brightness level can be corrected.

Further, an offset adder circuit comprising R23 and R24 is a circuit for controlling the output current of the brightness level and adjusts the output current value of brightness level by means of values of R23 and R24 as well as the voltage at a control terminal T32.

The auxiliary current mirror amplifier 40 will now be described. With reference to FIG. 3, the present amplifier 40 comprises a differential-single converter circuit for converting the differential current output of gain controller 31 into a single-ended signal, a PNP current mirror amplifier circuit for outputting a plurality of amplified currents and a base current correction circuit for correcting the dead zone of the PNP current Miller amplifier circuit.

The differential-single converter circuit includes a current mirror circuit comprising PNP transistors Q43–Q45 and resistors R41–R43. Collectors of Q43 and Q44, which are input and output terminals of the present current mirror circuit, are respectively connected to collectors of Q35 and Q36, which are outputs of the gain controller. Owing to this configuration, the collector current of Q44, which is the output of the current mirror circuit, becomes equivalent to the collector current of Q35, which is one of outputs of the gain controller 31. Therefore, the output of the differential-single converter circuit becomes equivalent to the difference between collector currents of Q35 and Q36 outputted from the gain controller 31. As a result, common mode noises caused by power supply noises and the like can be largely attenuated by this differential-single converter circuit. This results in an effect that parasitic oscillation caused by the feedback loop including the power supply line can be prevented.

The PNP current mirror amplifier circuit will now be described. The present circuit operates so that the output current will not exceed a predetermined maximum rated current. If a typical current mirror circuit amplifying a signal with an emitter area ratio (ratio of the numbers) is applied hereto, N output transistors are required irrespective of the current density. Therefore, capacity of the output transistors becomes large, high-speed operation being hindered.

Figure 5:
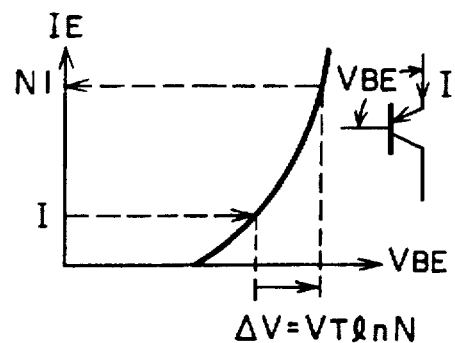
FIG. 5 is a characteristic diagram showing the operation principle of the current amplifier circuit of FIG. 3.
Figure 6:
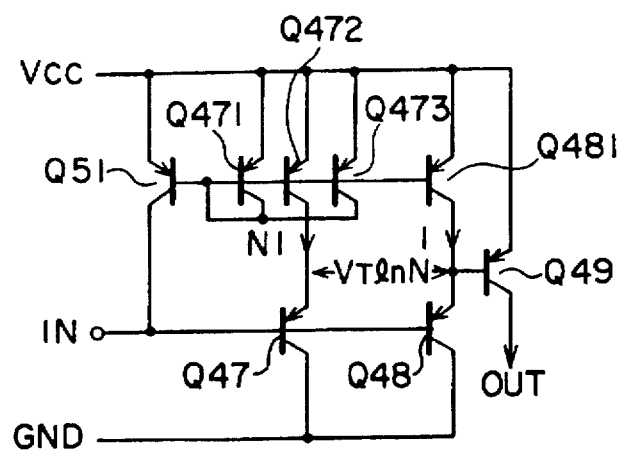
FIG. 6 is a circuit diagram showing the operation principle of the current amplifier circuit.

In the present circuit, input and output transistors are implemented with identical sizes. This principle is shown in FIGS. 5 and 6. FIG. 5 shows the relationship between the base-emitter voltage $V_{BE}$ of the transistor and the emitter current $I_E$ thereof. As evident from FIG. 5, current gain N can be obtained in a transistor having an identical size by driving the output transistor with $V_{BE}$ which is higher than $V_{BE}$ of the input transistor by $\Delta V(=V_T \ln N)$. FIG. 6 shows a current amplifier circuit devised on the basis of this idea. Since the emitter current ratio of transistors Q47 and Q48 having a common base is so controlled by a current mirror circuit comprising Q471–Q473 and Q481 as to be N:1, $V_{BE}$ of Q48 becomes smaller than that of Q47 by $V_T \ln N$. As a result, $V_{BE}$ of the output transistor Q49 is driven with voltage which is higher than that of the input transistor by $V_T \ln N$. The output current becomes equivalent to N times the input current.

In the current amplifier circuit shown in FIG. 6, gain N can be obtained by using input and output transistors having identical sizes. Therefore, the influence of the parasitic capacitance of the output transistor is not great, and high frequency characteristics can be improved.

With reference to FIG. 3, the PNP current Miller amplifier circuit comprises PNP transistors Q46–Q52 and resistors R44–R51. In the present configuration, the voltage $V_T \ln N$ is generated by defining the resistance ratio between resistors R46 and R47 as 1:N and defining the emitter current ratio between transistors Q47 and Q48 having a common base as N:1. This is because the terminal voltages of R46 and R47 are respectively defined by $V_{BE}$ of Q46 and Q49 and can be regarded equivalent for practical use. Further, the resistor R44 connected to the emitter of the input transistor Q46 and resistors R48–R51 respectively connected to emitters of output transistors Q49–Q52 are provided to prevent characteristics degradation caused by dispersion of $V_{BE}$ in transistors. The resistance ratio is defined as N:1.

Further, the resistor R45 connected to the base of the input transistor Q46 functions to correct the gain change of the current mirror circuit caused by a change in current gain $h_{fe}$ of a PNP transistor. With reference to FIG. 3, base currents of the input transistor Q46 and Q49–Q52 are respectively added to emitters of Q47 and Q48 for generating gain setting voltage. Assuming now that the number of output transistors is M (4 in FIG. 3), the sum of base currents of Q49–Q52 becomes M·N times the base current of Q46. If $h_{fe}$ decreases, therefore, the emitter current of Q48 increases and the gain decreases. If computed in terms of emitter resistance, the resistor R45 connected to the base of the input transistor Q46 becomes equivalent to $R45/h_{fe}$. This resistance is added to the emitter resistor R44. If $h_{fe}$ decreases, the emitter resistance of the input transistor increases and the gain increases. In this way, the gain change due to $h_{fe}$ has opposite polarities in the base current of the output transistor and the resistor R45. Therefore, the gain change due to $h_{fe}$ can be corrected by R45. In general, $h_{fe}$ largely changes with temperature. Therefore, the present circuit brings about an effect that the gain change due to temperature can also be reduced.

The base current correction circuit will now be described. In the above described PNP current Miller amplifier circuit, emitter currents of transistors Q47 and Q48 having a common base become nearly constant currents irrespective of the input current. The product of this current and $1/h_{fe}$ becomes the base current $I_B$. Since this base current $I_B$ is taken from the input current, a dead zone is generated in the input-output characteristics. The base current correction circuit is a circuit for correcting this dead zone and comprises transistors Q53–Q55, resistors R52 and R53, and a capacitor C6. This circuit is so configured that the sum of collector currents of Q47 and Q48 may flow into Q53 and the base current of Q53 may be folded back by a current mirror circuit comprising Q54, Q55, R52 and R53 and may be let flow into bases of Q47 and Q48. Since $h_{fe}$ of Q47, Q48 and Q53 are nearly equal, the base current of Q53 is equivalent to the sum of base currents of Q47 and Q48. Therefore, the current supplied to the base of Q47 aid Q48 becomes equal to the current supplied to the base of Q53. As a result, the dead zone in the input-output characteristics can be removed.

Further, in the present auxiliary current mirror amplifier 40, the collector of the output transistor Q23 of the variable bias current generation circuit is connected to the collector of the current mirror input transistor Q55 to add the output current difference of the gain controller 31 and the output current of the variable bias current generation circuit together.

The current mirror/current amplifier circuits comprising NPN transistors will now be described. In FIG. 3, NPN current mirror/current amplifier circuits are used in four blocks 51–54. Configuration and operation of this circuit will now be described by referring to the circuit of block 51. This circuit is based upon a current mirror circuit of base current correction type. That is to say, principal components are transistors Q56 and Q58 and resistors R54 and R55 for setting the current mirror ratio and a transistor Q57 and a resistor R58 for correcting the base current. For stabilizing the high-frequency response, resistors R56 and R57 and a capacitor C7 are added.

The emitter area ratio of Q56 and Q58 is so defined as to be in proportion to the current amplification factor, and resistance ratios R54/R55 and R56/R57 are so defined as to be in inverse proportion to the current amplification factor. By this setting, voltage drop across R54 becomes equivalent to that across R55, and hence Q56 and Q58 can be driven with equivalent base-emitter voltages. As a result, the ratio of the input current to the output current becomes equivalent to the current amplification factor which has been set.

In this circuit, the base current correction transistor Q57 operates as an emitter follower and drives the output transistor Q58. If the current amplification factor of this output transistor is increased, the emitter area is increased and the emitter resistor R55 is decreased. Therefore, the output transistor Q58 becomes a large capacity load. It is known that oscillation is caused in the response of such configuration in which a capacity is driven by an emitter follower circuit. The resistor R57 of this circuit limits lowering in high-frequency impedance of the load and thereby prevents oscillation.

Further, the capacitor C7 lowers the high-frequency impedance of the emitter of Q56 to lower the peak in frequency characteristics caused by the negative feedback loop comprising Q56 and Q57.

Current operation and the complementary bipolar transistor circuit adopted in accordance with the present invention facilitates the operation of FIG. 3 heretofore described.

Figure 7:
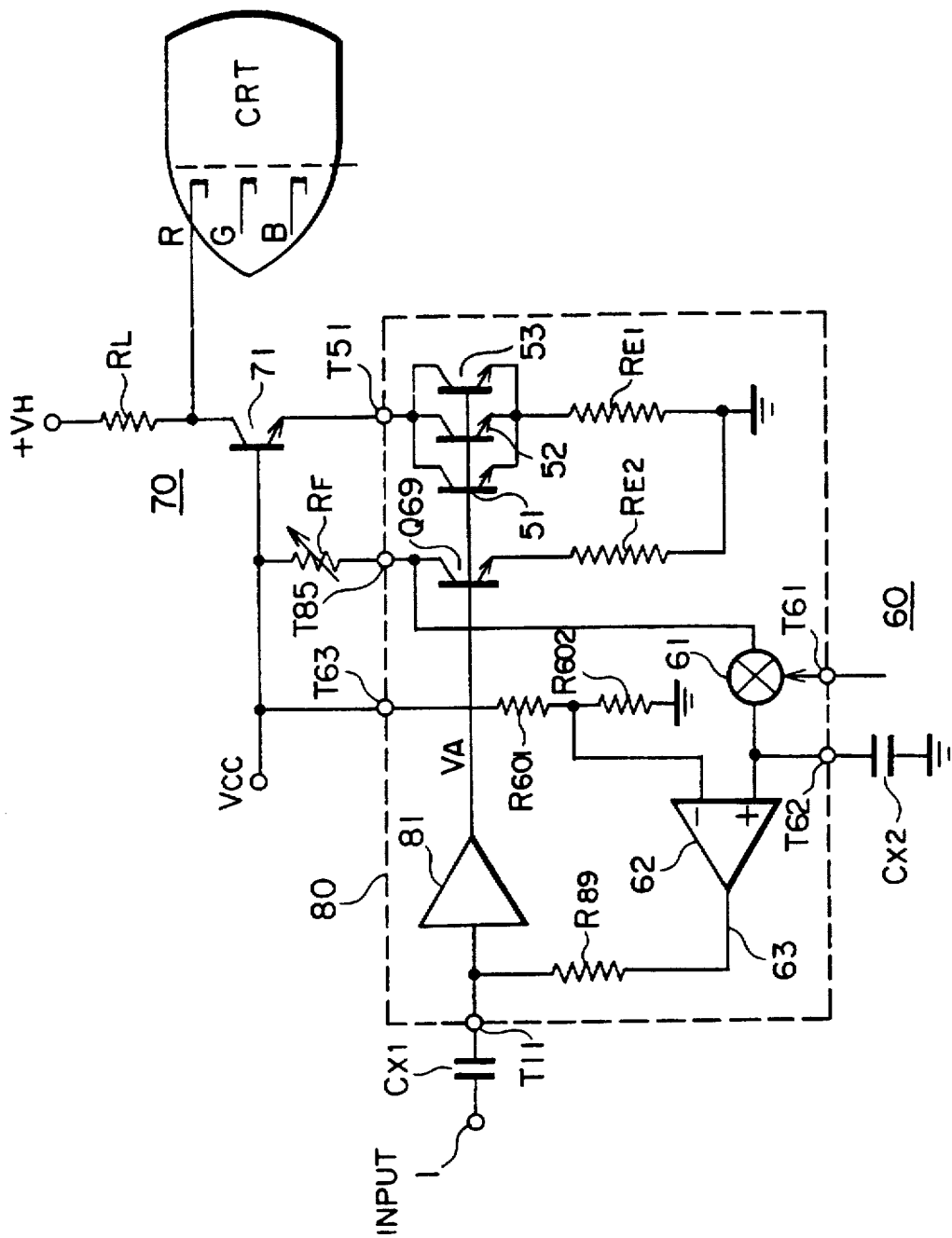
FIG. 7 is a circuit diagram showing another embodiment of a video amplifier of indirect feedback.

FIG. 7 shows another embodiment of the video amplifier of indirect feedback type. In FIG. 7, the video amplifier comprises a drive stage LSI 80 of low-voltage section, a high voltage output stage 70 and a sample-and-hold circuit 60. An input signal (not illustrated) is supplied from a terminal 1 to an input terminal T11 of the low-voltage section via an input capacitance $C_{X1}$. The output of the output stage 70 is coupled to the cathode R of a CRT. Voltage feeding power supply of FIG. 7 comprises high-voltage power supply $+V_H$ (such as 120 V) and low-voltage power supply $+V_{cc}$ (such as 10 V).

The high-voltage output stage 70 comprises a load resistor $R_L$ having a value of several hundred ohms and a high-frequency power transistor 71. Fixed voltage of $+V_{cc}$ is supplied to the base of the high-frequency power transistor 71. An emitter follower comprising transistors 51, 52 and 53 of the low-voltage section and their emitter resistor $R_{E1}$ is connected in series with the emitter of the power transistor 71 to form a so-called cascade amplifier. Further, an emitter follower having a small capacity and comprising a transistor Q69 having the common base and an emitter resistor $R_{E2}$ is connected in parallel to the cascade emitter follower. The common base of the transistors is connected to the output of a preamplifier 81. The collector of the transistor Q69 is connected to the power supply $+V_{cc}$ via a resistor $R_F$ and is also inputted to a switch 61 of the sample-and-hold circuit 60. The output side of the switch 61 is connected to a hold capacitor $C_{X2}$ and the input side of an amplifier 62. The other input of the amplifier 62 is supplied with voltage, which is obtained by dividing the voltage of the power supply $+V_{cc}$ by using resistors R601 and R602. The output side 63 of the amplifier 62 is connected to the input of the preamplifier 81 via a resistor R89. The open-loop gain of this closed loop is approximately several hundreds.

Assuming in FIG. 7 that the base-emitter voltage of the transistors Q69, Q51, Q52 and Q53 is $V_{BE}$ and the output voltage of the amplifier 81 is $V_A$, the desired DC bias output $V_o$ of the high-voltage output stage and the feedback voltage $V_F$ fed from the corresponding transistor Q69 can be represented by the following equations.

$$V_o = V_H - \frac{R_L}{R_{E1}}(V_A - V_{BE}) \quad (5)$$

$$V_F = V_{cc} - \frac{R_F}{R_{E2}}(V_A - V_{BE}) \quad (6)$$

From the equations (5) and (6), we get $$\frac{R_F R_{E1}}{R_L R_{E2}} = \frac{V_{cc} - V_F}{V_H - V_o} = \frac{V_{cc}(1-k)}{V_H - V_o} \quad (7)$$

where k in the equation (7) is the reference input voltage division ratio (=R602/(R601+R602)) of the amplifier 62 of the sample-and-hold circuit. With respect to the desired $V_o$, therefore, the variable resistor $R_F$ shown in FIG. 7 is so set as to satisfy the equation (7).

Operation in the configuration heretofore described will now be discussed. If a sampling pulse is applied to a control input terminal T61 of the sample-and-hold circuit 60 during the interval indicated as back porch in the waveform of FIG. 2, voltage corresponding to the output voltage in the back porch interval is sampled and held and then compared with the reference value. The result of comparison is negatively fed back via the amplifier 62 and the resistor R89 to modify the output voltage. Since the sampling, pulse is periodically applied every horizontal synchronization (1H interval), eventually the DC voltage of the output voltage becomes equivalent to the desired preset value and that value is held. In the above described equation (7) and configuration of FIG. 7, it should be noted that the relationship between the output voltage and feedback voltage becomes a symmetrical differential relation which does not depend upon temperature and the like. Therefore, control is performed with fine precision similar to that of feedback from the high-voltage output section.

Since bias control of the output voltage can thus be performed by using the circuit of the low-voltage section alone, the load of the high-voltage output section is lightened (to become approximately 1 to 2 pF). Bandwidth improvement of several tens % and reduction of high-frequency power dissipation become possible. Further, it is desirable to omit the feedback resistor of the high-voltage section from the viewpoint of cost and reliability as well. Omission of the feedback resistor facilitates circuit integration as well.

Figure 8:
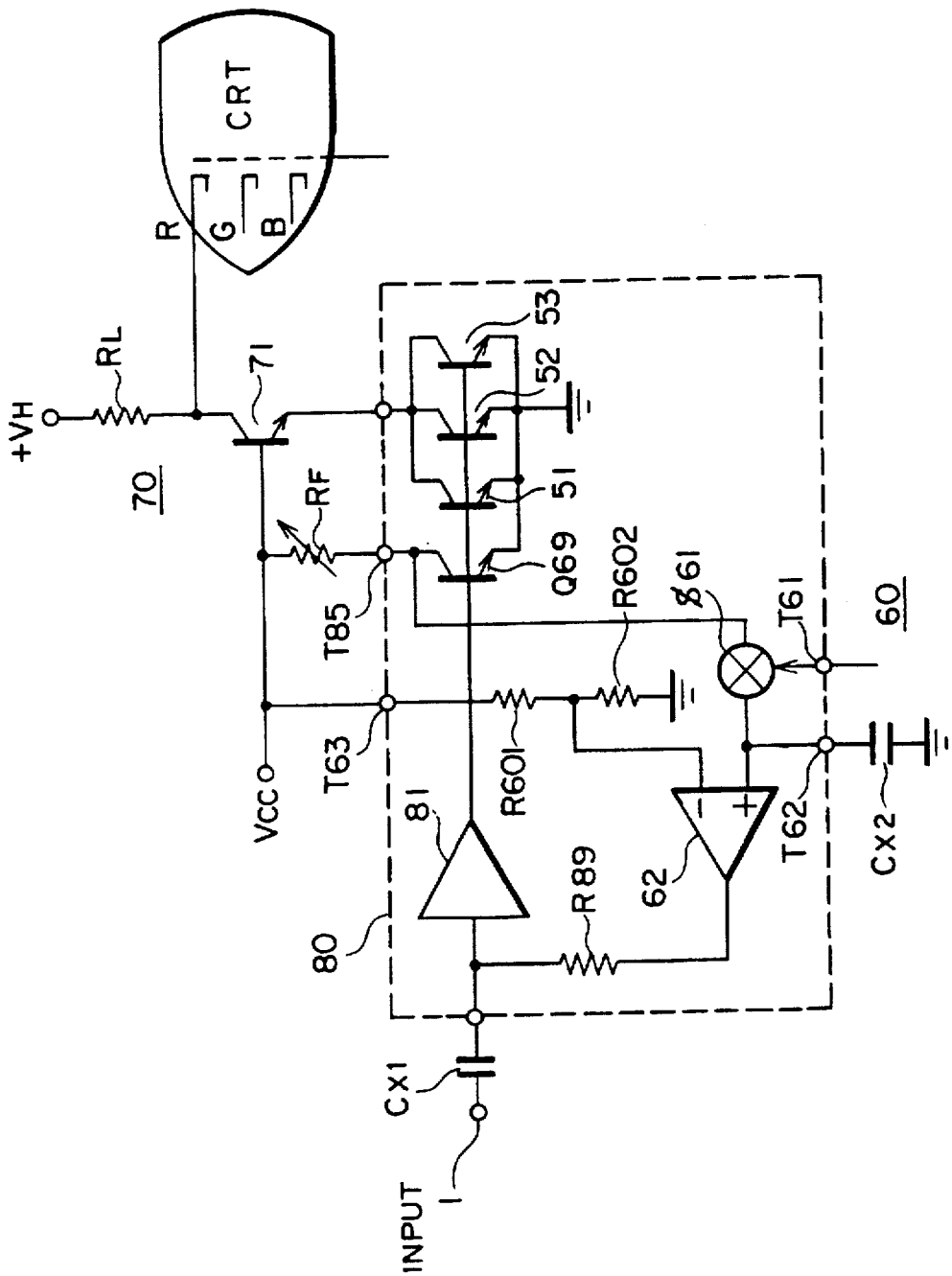
FIG. 8 is a circuit diagram of the video amplifier of indirect feedback type shown in the embodiment of FIG. 1.
Figure 9:
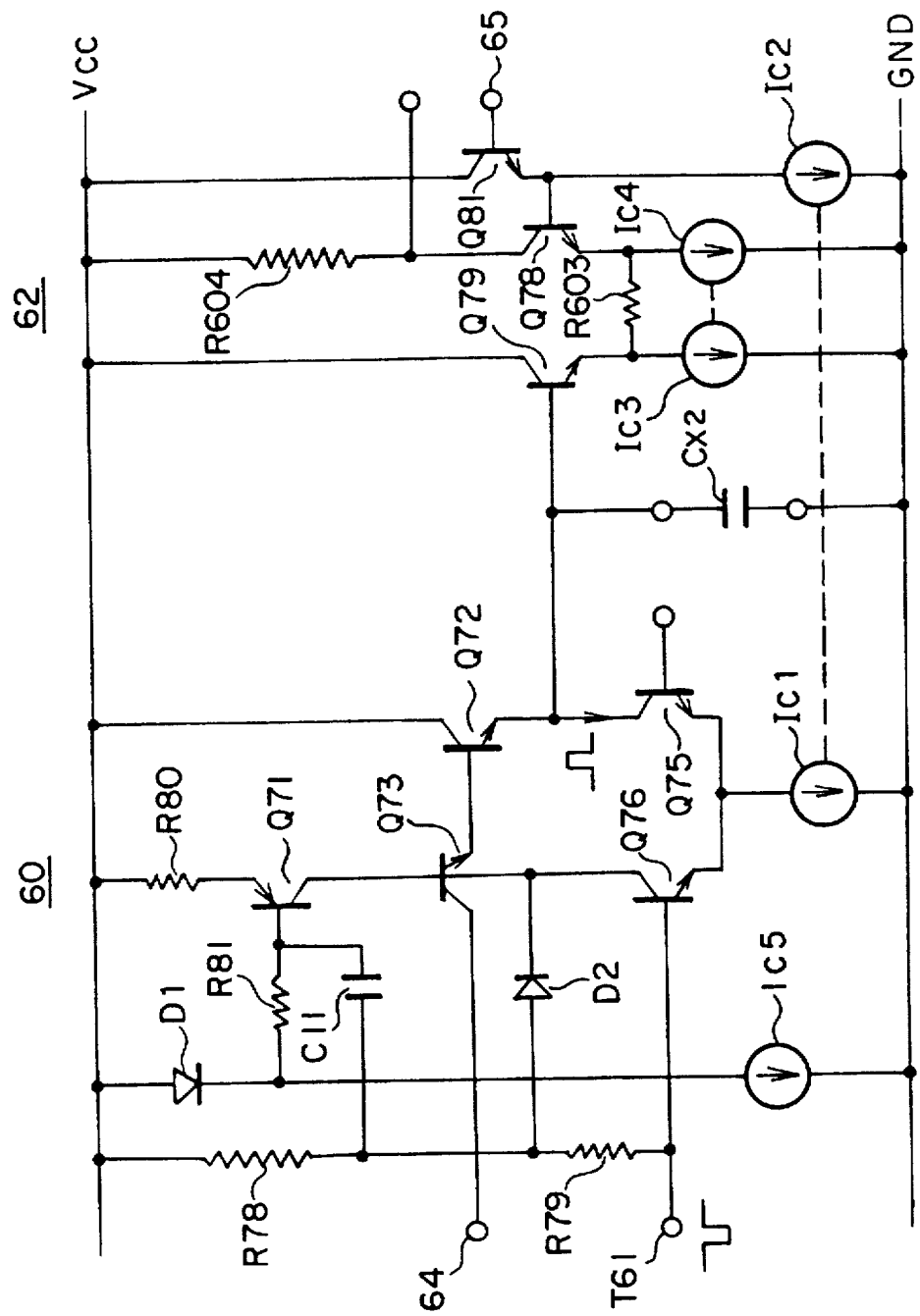
FIG. 9 is a circuit diagram of a sample-and-hold circuit shown in the embodiment of FIG. 3.

FIG. 8 shows an embodiment of a video amplifier of indirect feedback type which has been applied to the embodiment of FIG. 1. FIG. 9 shows an embodiment of a sample-and-hold circuit which has been applied to the embodiment of FIG. 3. Configuration and operation of FIGS. 8 and 9 will now be described herein because they are equivalent to those of FIGS. 1 and 3.

Figure 10:
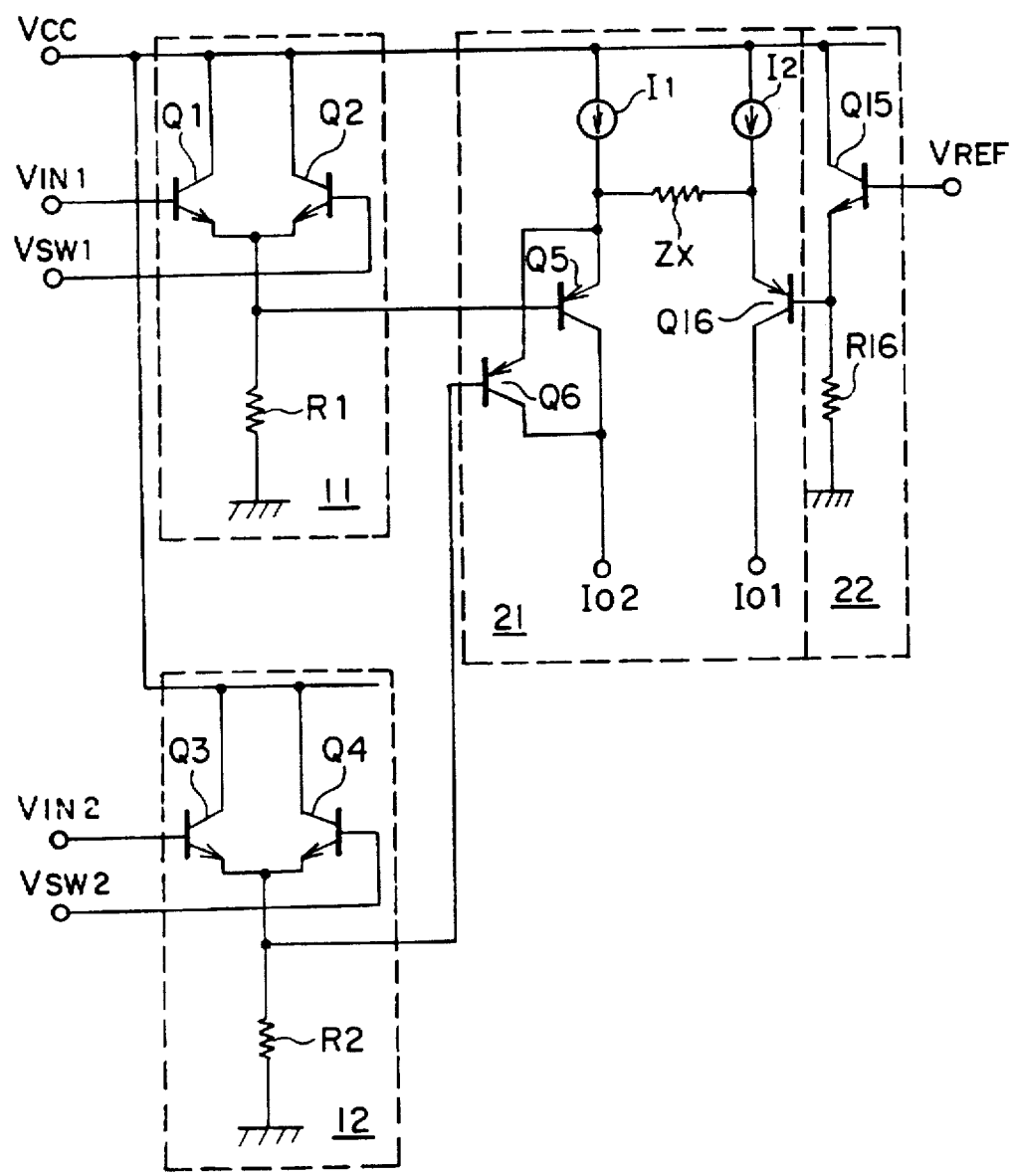
FIG. 10 is a circuit diagram of the multiplexer shown in the embodiment of FIG. 3.

FIG. 10 shows an embodiment of the multiplexer which has been applied to the embodiment of FIG. 3. Configuration and operation of the present embodiment are the same as those which have been described with reference to FIG. 3.

Figure 11:
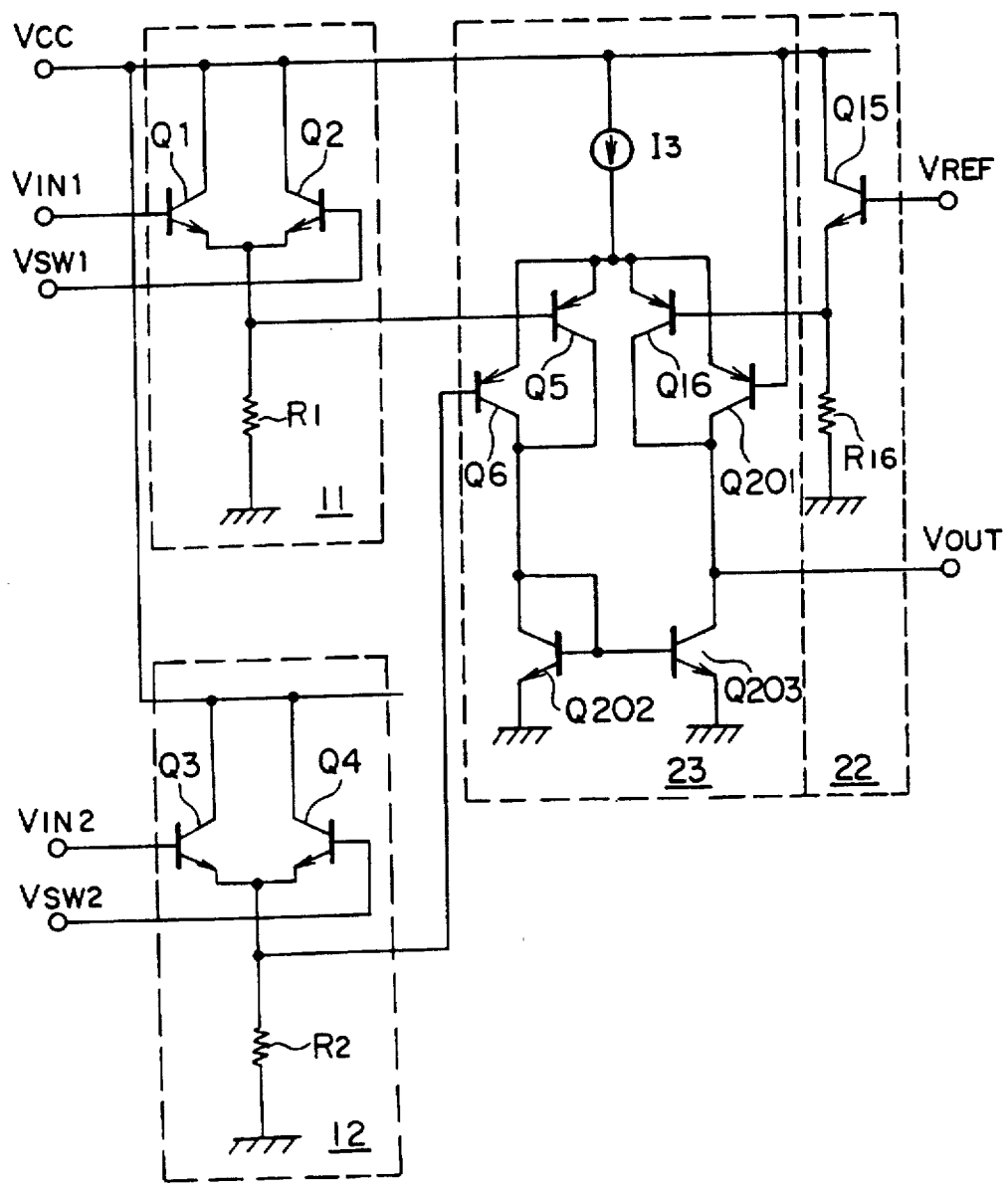
FIG. 11 is a circuit diagram showing another embodiment of the multiplexer.

FIG. 11 shows another embodiment of the multiplexer. In the present embodiment, the multiplexer is applied to a differential amplifier circuit comprising transistors Q5, Q6 and Q201–Q203, and a constant current source $I_3$. In the present embodiment as well, GND and $V_{cc}$ are respectively inputted to control signal inputs $V_{SW1}$ and $V_{SW2}$ when an input signal $V_{IN1}$ is to be selected. As a result, Q3 and Q6 turn off, whereas Q1 and Q5 serve as emitter followers. Therefore, $V_{IN1}$ is selected as the input of the differential amplifier circuit. At this time, the base voltage of Q5, which is one input of the differential amplifier circuit, becomes $V_{IN1} - V_{BE}$, whereas the base voltage of Q16, which is the other input, becomes $V_{REF} - V_{BE}$. In the present embodiment as well, therefore, offset voltage can be made small by matching Q1 and R1 to Q15 and R16 well.

Other embodiments of the current amplifier circuit used in the auxiliary current Miller amplifier 40 will now be described by referring to FIGS. 12 to 16.

Figure 12:
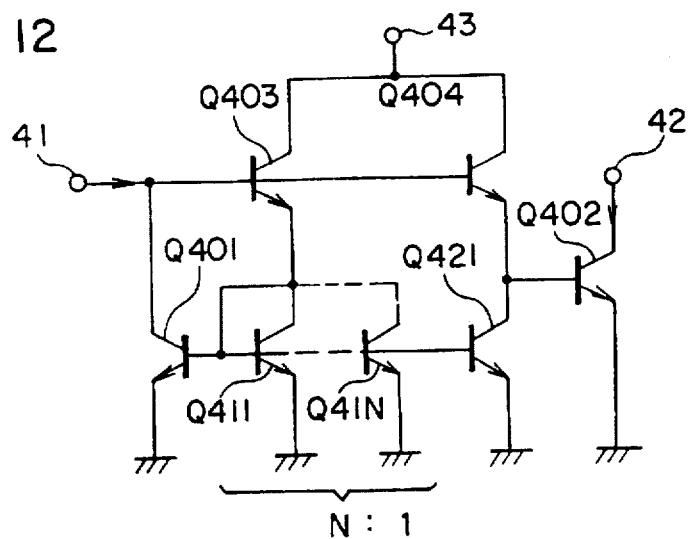
FIGS. 12 to 16 are diagrams for describing other embodiments of the current amplifier circuit.

With reference to FIG. 12, numerals 41, 42 and 43 denote an input terminal, an output terminal and a power supply terminal. Further, Q401 and Q402 denote two transistors having common emitter connection, whereas Q403 and Q404 denote two transistors having common base connection. A bridge circuit is formed by base-emitter diodes of Q401 to Q404. Further, transistors Q401, Q411–Q41N and Q421 form a current mirror configuration. The collector of the transistor Q401 is connected to the input terminal 41. Collectors of the transistors Q411–Q41N are connected to the emitter of the transistor Q403. The collector of the transistor Q421 is connected to the emitter of the transistor Q404. Further, bases of the transistors Q403 and Q404 are connected to the input terminal 41 and collectors of them are connected to the power supply terminal 43. Further, the collector of the transistor Q402 is connected to the output terminal 42.

Assuming in this configuration of FIG. 12 that the current mirror circuit comprising the transistors Q401 and Q411–Q41N is closed by a feedback loop including the transistor Q403 and N transistors each having the same emitter area as that of the transistor Q401 are used as the transistors Q411 to Q41N, an input current $I_i$ applied to the input terminal 41 lets flow $I_i$ through the transistor Q401 and $I_i$ through each of the transistors Q411–Q41N (i.e., $NI_i$ in total through Q411–Q41N). On the other hand, the transistor Q421 has a current mirror relationship to the transistor Q401. Since a transistor having the same emitter area as that of the transistor Q401 is thus used as the transistor Q421, $I_i$ flows through the transistor Q421 as well. As a result, $NI_i$ and $I_i$ respectively flow through two transistors Q403 and Q404 having common base connection.

Assuming now that the base-emitter voltage values of the transistors Q401, Q402, Q403 and Q404 included in the diode bridge circuit are $V_{BE1}$, $V_{BE2}$, $V_{BE3}$ and $V_{BE4}$, the following relation holds true.

$$V_{BE1} + V_{BE3} = V_{BE4} + V_{BE2} \quad (8)$$

Respective base-emitter voltage values of the equation (8) are represented as $$V_{BE1} = V_T \ln \frac{I_i}{A_E I_{So}} \quad (9)$$

$$V_{BE2} = V_T \ln \frac{I_o}{A_E I_{So}} \quad (10)$$

-continued $$V_{BE3} = V_T \ln \frac{NI_i}{A_E I_{So}} \quad (11)$$

$$V_{BE4} = V_T \ln \frac{I_i}{A_E I_{So}} \quad (12)$$

where $V_T$=thermal voltage $A_E$=area of transistor emitter $I_{So}$=reverse collector saturation current per unit area $I_o$=collector current of transistor Q404, i.e., output current taken out from output terminal 42.

Substituting the equations (9) and (12) into the equation (8) and rearranging the equation, we get equation (13).

$$I_o = NI_i \quad (13)$$

That is to say, it is indicated that the current Miller ratio of the transistors Q411–Q41N and the transistor Q421 becomes the current gain N and does not depend upon the absolute value of the current Miller current.

This principle is based upon the fact that the base-emitter voltage $V_{BE2}$ of the transistor Q402 is apparently increased by $\Delta V$ by forming a diode bridge circuit with the transistors Q401 to Q404 each having the same emitter area, generating a potential difference $\Delta V$ (=$V_{BE3}$-$V_{BE4}$=$V_T \ln N$) between emitters of the two transistors Q403 and Q404 having common base connection, and applying this $\Delta V$ between based of the two transistors Q401 and Q402 having common emitter connection. At the collector of the transistor Q402 with this $\Delta V$ added, the output current $I_o$ equivalent to N times the collector current of the transistor Q401, i.e., the input current $I_i$ as expressed by the equation (13) can be obtained.

In the present embodiment heretofore described, high-frequency characteristics can be improved because the diode bridge circuit operates at high speed (because the base-emitter voltage of the transistor does not vary owing to the diode connection, and, hence, the parasitic capacity of the transistor exerts little influence) and the parasitic capacity limiting the bandwidth can be made small because of the minimum number of output transistors.

Further, the current values of the transistors Q403 and Q404 can be so set as to be linked to the input current $I_i$, and currents flowing through opposing transistors of the diode bridge circuit can be made equal. Therefore, the operation begins with 0 in the input current $I_i$ (as represented by the characteristic shown in (a) of FIG. 14) and the linearity of the input-output characteristic is also fine.

In the above described embodiment, a current linked to the input current $I_i$ flows through an totem-pole comprising the transistors Q404 and Q421. Since the transistors Q404 and Q421 operate in canceling directions, however, the output current $I_o$ at high frequencies is limited. By letting flow a constant current through the transistor Q421 of the totem-pole, canceling action of the transistors Q404 and Q421 is eliminated and the high-frequency characteristic can be further improved.

Figure 13:
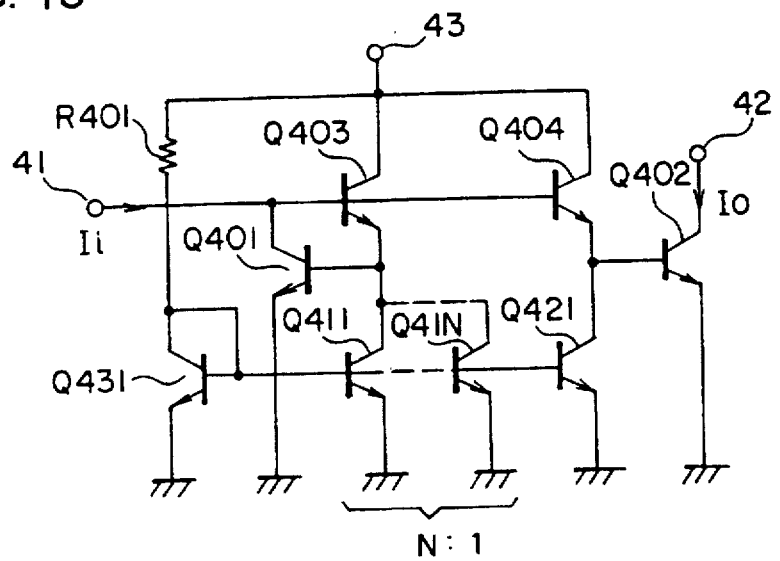

Another embodiment of the present invention for realizing this is shown in FIG. 13. The embodiment of FIG. 13 differs from that of FIG. 12 in that a current Miller is formed by transistors Q411 to Q41N, Q421 and Q431 and constant currents are let flow through two transistors Q403 and Q404 having common base connection. If the current mirror ratio of the transistors Q411–Q41N and Q421 is defined as N:1, the equation (13) holds true in this case as well and the current gain N can be obtained.

Figure 14:
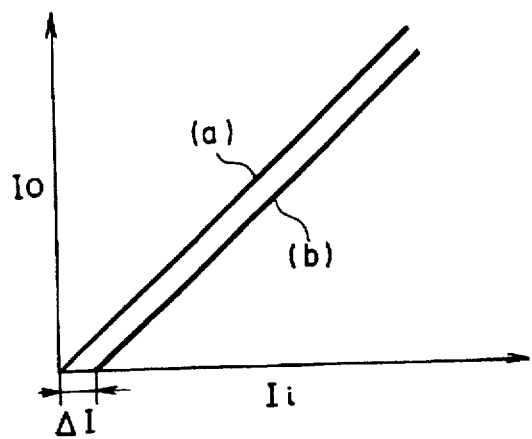

In the above described embodiment of FIG. 13, constant currents are permitted to flow through the two transistors Q403 and Q404 having a common base connection. Therefore, only the current divided by the current amplification factor of the transistor is taken out from the input current $I_i$ as the base current $\Delta I$, resulting in the input-output characteristic as represented by a straight line (b) of FIG. 14. This $\Delta I$ becomes a dead zone. If the input current $I_i$ is less than $\Delta I$, the output current $I_o$ is not obtained. Therefore, an embodiment of the present invention in which the output current $I_o$ is obtained from 0 of the input current $I_i$ as shown in (a) of FIG. 14 is shown in FIG. 15.

Figure 15:
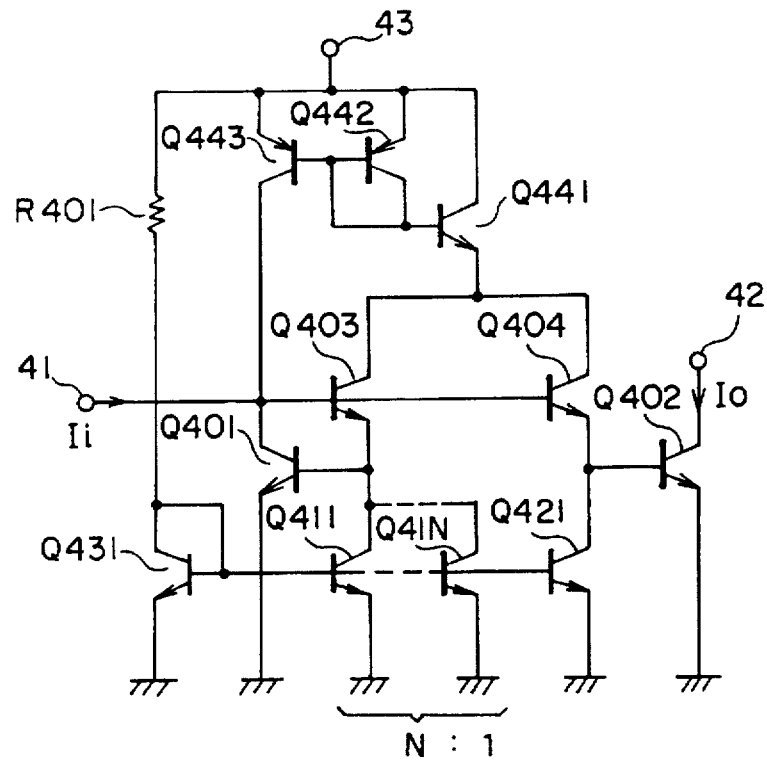

In FIG. 15, transistors Q441, Q442 and Q443 are provided. A current equivalent to the quotient of the sum of currents flowing through two transistors Q403 and Q404 having a common base connection divided by the current amplification factor is taken out by the transistor Q441 (having the same emitter area as that of each of the transistors Q403 and Q404) and is then added to the input terminal 41 by a current mirror circuit comprising the transistors Q442 and Q443. The dead zone $\Delta I$ is thus eliminated by base current correction.

In the embodiments of FIGS. 12, 13 and 15 heretofore described, the current amplifier has single-output configuration. However, multi-output configuration is also possible. Since this case can be realized by increasing output transistors by the number of multiple outputs, the high-frequency characteristic is not so largely degraded as compared with the case of single output.

Further, by inserting resistors on the emitter side of the two transistors having common emitter connection and transistors of the current mirror circuit, high-frequency characteristic can be further improved, resulting in an effect. In this case, resistor values are so chosen that the voltage across resistor may be constant depending upon the ratio between currents let flow through transistors.

If the current gain is to be 1/N, it is obtained by changing the current mirror ratio between currents let flow through two transistors having common base connection from N:1 to 1:N.

Figure 16:
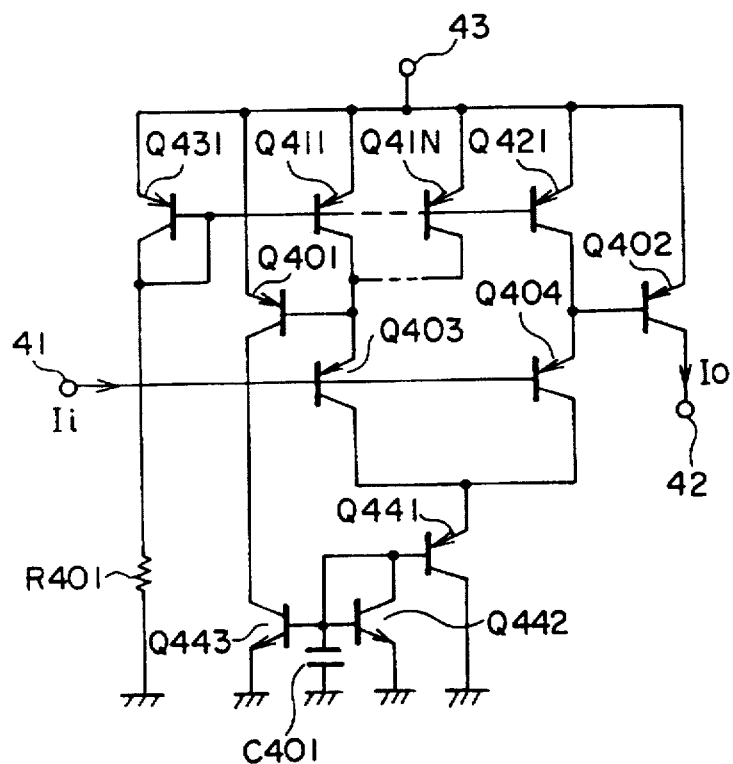

Although transistors used in the current amplifier are NPN transistors in the foregoing description, the NPN transistors may be replaced by PNP transistors to yield an output of source type. FIG. 16 shows an embodiment obtained by replacing NPN transistors of the embodiment shown in FIG. 15 by PNP transistors. In this case as well, an effect similar to that of FIG. 15 is obtained with respect to the high-frequency characteristic. In particular, a capacitor inserted between the base of the transistor Q441 and the ground potential has an effect of limiting the amount of base current correction feedback at high frequencies and of thereby flattening the frequency characteristic. Even in a PNP transistor or a vertical transistor, the transition frequency $f_T$ is lower than that of an NPN transistor. Therefore, the present invention brings about a larger effect when PNP transistors are used.

Other embodiments of the present invention using a complementary transistor circuit will now be described concretely by referring to FIGS. 17 to 28.

FIG. 17 is a video amplifier according to another embodiment of the present invention, and a CRT display device using the video amplifier. The present embodiment is not the indirect feedback type as shown in FIGS. 1 and 3, but a video amplifier of direct feedback type, and a CRT display device using that video amplifier. The video amplifier in the present embodiment is a complementary video amplifier circuit comprising a multiplexer 100 with buffer, a video gain controller 300 of current output type, a current mirror circuit 400 having a plurality of outputs, and an amplifier 500 for the multi-output current mirror circuit. The output is applied to the cathode of a CRT 700.

In FIG. 17, the multiplexer 100 with buffer comprises a differential stage including a pair of NPN transistors 211 and 212, a constant current circuit 213 for current biasing located at the common emitter side of the transistors 211 and 212, a pair of PNP transistors 231 and 232, and a constant current circuit 233 for current biasing located at the common emitter side of the transistors 231 and 232. The pair of PNP transistors 231 and 232 and the constant current circuit 233 are symmetrical to the pair of NPN transistors 211 and 212 and the constant current circuit 213. The emitter output of the differential stage of NPN transistors is connected to the base of the PNP transistor 231 of the succeeding differential stage via wiring 234. In the same way, the signal of a different NPN differential stage (not illustrated) is connected to the base of the other PNP transistor. The input to this circuit 100 is supplied via a terminal 201, and the output signal is outputted from the common emitter of the PNP differential stage via wiring 235. Values of the constant current circuits 213 and 233 are so set at nearly identical values such as approximately 1 mA as to attain good complementariness.

Operation of the afore-mentioned multiplexer 100 with buffer will now be described. An input voltage signal is applied to the terminal 100. If the voltage of a control terminal 204 is lower than the potential of the input terminal 201, the transistor 212 turns off and the input signal is transmitted to the transistor 231 of the next stage via an emitter follower comprising the transistor 211. The input of the transistor 232 is brought into the cut-off state. In the same way, the succeeding stage also operates as an emitter follower, and the output signal is outputted from a signal line 235. That is to say the equivalent circuit in such a state that this output is selected becomes a two-stage circuit of emitter followers exhibiting low output impedance $Z_o$ (which can be represented as $kT/(qI_E)$ and which is approximately 26 ohms when $I_E$=1 mA) and high impedance $Z_{of}'$ (the output impedance of the constant potential circuit and cut-off leak impedance of the cut-off transistor) as shown in FIG. 18A. This circuit operates as a buffer having high input impedance and low output impedance. Further, signal attenuation is extremely slight, (for example, it is typically less than 1%). Further, this circuit performs wideband operation.

When the input signal is to be cut off, the voltage of the control input terminal 204 is made higher than that of the input to cut-off the transistor 211 of the signal source side. In the same way, the transistor 231 is cut off in the succeeding PNP stage. In this case, the equivalent circuit becomes as shown in FIG. 18B. As compared with the output impedance $Z_{on}$ of the emitter, the input cut-off impedance $Z_{off}$ of the transistor satisfies the relation $Z_{on} \ll Z_{off}$ even at high frequencies. Therefore, attenuation in the cut-off state becomes extremely large as represented by $(Z_{on} \ll Z_{off})^2$. In one concrete example of calculation, attenuation has a value of 55 dB even at 300 MHz. An extremely excellent video multiplexer can thus be realized. Further, since the first and second differential stages respectively comprise NPN and PNP complementary transistors, level shifts between the input and output inclusive of a change caused by temperature cancel each other, resulting in little shift. Further, since only two serial transistors are connected in series with the power supply voltage, a relatively large signal input range is allowed even when low power supply voltage issued. These features are features which are not found in conventional two-stage differential switches of cascade connection comprising transistors of identical polarities.

The video gain controller 300 of current output type will now be described.

The video gain controller 300 shown in FIG. 17 mainly comprises a so-called variable conductance multiplier circuit including a differential stage formed by cross-coupling collector electrodes of NPN transistors 311–314, and a linearizing logarithm bias circuit including transistors 331 and 332, a voltage-current converter circuit 35 and a voltage divider circuit using resistors 333 and 334. A voltage-current converter circuit comprising transistors 315 and 316, a resistor 323 and constant current circuits 321 and 322 is connected to common emitter of the transistor pair 311–312 and common emitter of the transistor pair 313–314. One pair of the cross-coupled transistor pairs is connected to diodes 318 and 319 (i.e., balancing diodes of Early effect). The other pair of the cross-coupled transistor pairs is connected to a current mirror circuit which comprises PNP transistors 317, 401 and 411 having polarities complementary to those of transistors included in the multiplier circuit.

The input voltage of a bias terminal 303 of the voltage-current converter circuit is fixed at a nearly middle value in the input signal range. Therefore, the difference between the input signal voltage applied to the base of the transistor 315 and the bias voltage of the terminal 303 is converted into a current signal by the resistor 323. The resultant current signal is supplied to the cross-coupled differential transistors 311–314 forming the multiplier circuit. On the other hand, the transistor 331 and 332 and the voltage-current converter circuit 35 connected to the base side of the differential transistors 311–314 form the linearizing bias circuit as described before. The linearizing bias circuit changes the current flowing through the differential transistor pairs in proportion to the voltage applied between control input terminals 351 and 352. Therefore, the output current flowing through a transistor 320 located at the load side of the gain controller 300 is in proportion to the base input voltage of the transistor 315 and is changed linearly by the control voltage between the control input terminals 351 and 352, resulting in a gain controller.

One of the practically important points in the gain controller thus far disclosed is that the output signal is used as a current signal via the transistor 317 of the complementary pair. Therefore, multipliers other than transistor conductance type can also be effectively applied to the present invention. For example, similar advantages are obtained even when a multiplier using current distribution at the differential stage known as a variable gain amplifier circuit of gain addition type is used. Further, since the multiplier disclosed in the embodiment uses the dependence of the transconductance of the transistor upon the amount of emitter current bias, it is more advantageous to use current output as compared with voltage output in aspects of precision and speed. Further, current output is significantly advantageous in that a larger dynamic range (i.e., a larger signal-to-noise ratio) is obtained with limitted power supply voltage and high speed operation is allowed because of less influence of charge and discharge of parasitic capacity caused by a voltage change of the output node.

Further, advantages of the complementary transistor circuit with respect to the output stage will now be described. The PNP transistor 317 inserted into the output of the video gain controller 300 serves as a reference transistor of the PNP current mirror circuit 400. That is to say, the output current of the gain controller 300 flows through collectors of respective output transistors 411–41n of the current mirror circuit 400 having a base current correction transistor 401 with accurate design multiplying factors with respect to the reference transistor. That is to say, the current Miller circuit 400 has function of current distribution and current amplification (including amplification with a multiplication factor of unity). Respective current outputs from the current mirror circuit 400 are inputted to the current mirror amplifier 500 as current signals and are amplified. In essence, the current multiplication factor is defined by the emitter dimension ratio between transistors 511–51$n$ of the input side and transistors 521–52$n$ of the output side. In order to improve the precision of current ratio and make linearity of response speed and high speed performance favorable, however, emitter resistors 541–54$n$ and 551–55$n$ which are in inverse proportion to the emitter dimension ratio are respectively inserted into emitters of respective input and output transistors, and transistors 531–53$n$ for base current correction are used. Outputs of the current mirror amplifier 500 are supplied as the emitter current of a transistor 71 via terminals 571–57$n$, respectively.

The collector voltage of the transistor 71 is applied to a cathode 701 of the CRT 700 as a contrast signal. As the composite of these signals R, G and B, the CRT 700 displays a color signal. Numeral 761 denotes a voltage source and numeral 763 denotes a load resistor.

Current amplification performed by the complementary current mirror circuit heretofore described is executed at high speed because of its current operation. Even with low power supply voltage, a large dynamic range is obtained. Further, because of a current signal, the complementary current mirror circuit is not affected by a change in potential caused by grounding impedance of the current mirror circuit. This fact becomes a large advantage especially in a large current output stage. Further, when complementary transistors are used, circuit and connection can be simplified and hence the circuit is essentially suitable to speed increase and the dimension can also be reduced.

Figure 19:
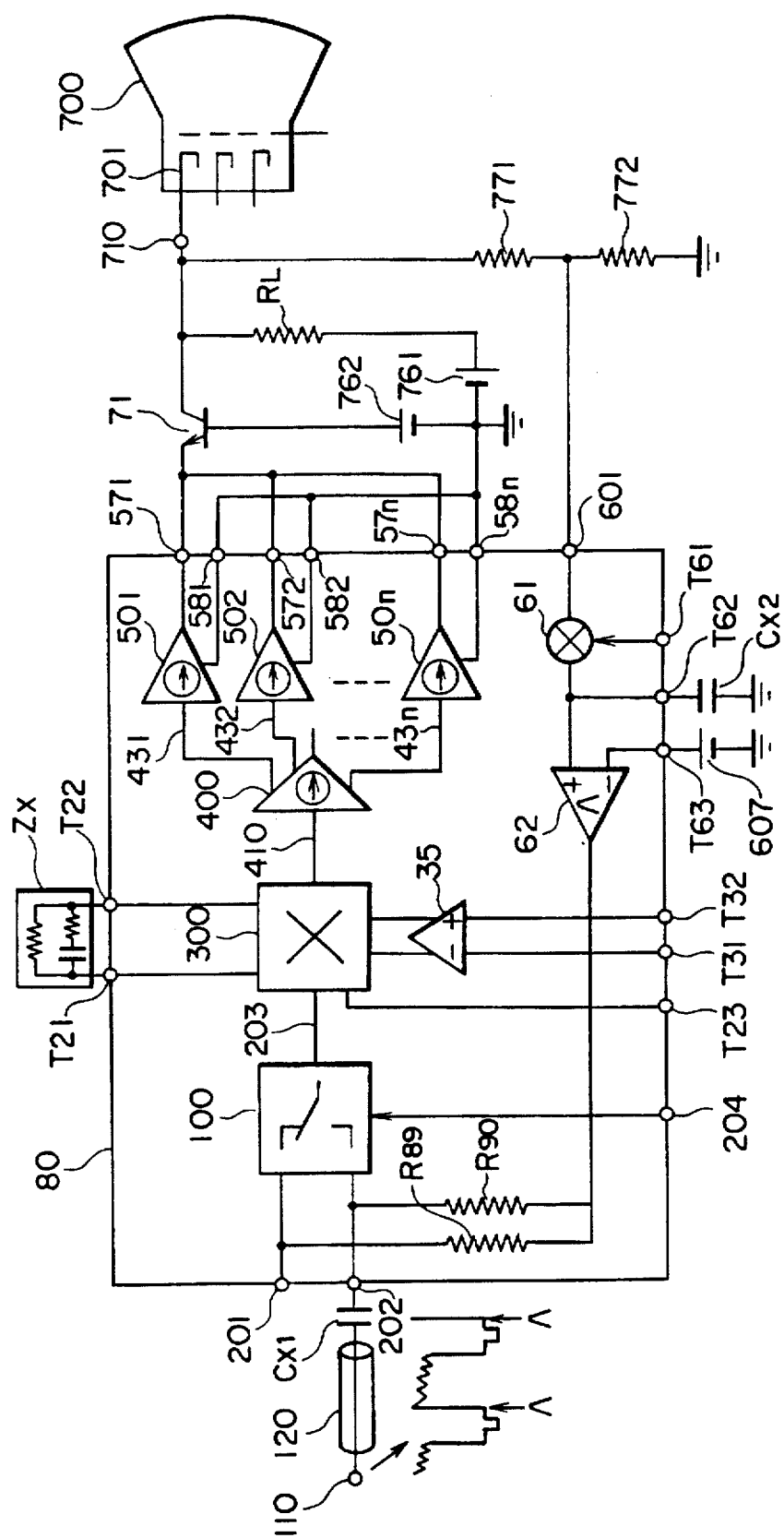
FIG. 19 is a circuit block diagram showing another embodiment of the present invention.

An embodiment of a concrete system application of the present invention will now be described by referring to FIG. 19. FIG. 19 is a block diagram of a video amplifier system of a high definition CRT display device according to another embodiment of the present invention. With reference to FIG. 19, a video amplifier IC 80 of a single chip comprises a dual-input buffer 100, a video gain controller 300, a current mirror 400 for signal distribution, and a plurality of current mirror amplifiers 501–50$n$. These function blocks are connected in cascade as illustrated. The video amplifier IC 80 further comprises a sampling switch 61, an amplifier 62 and bias resistors R89 and R90. Like function blocks are denoted by the same numerals as those of FIG. 3 or FIG. 17 already described in detail.

Figure 20:
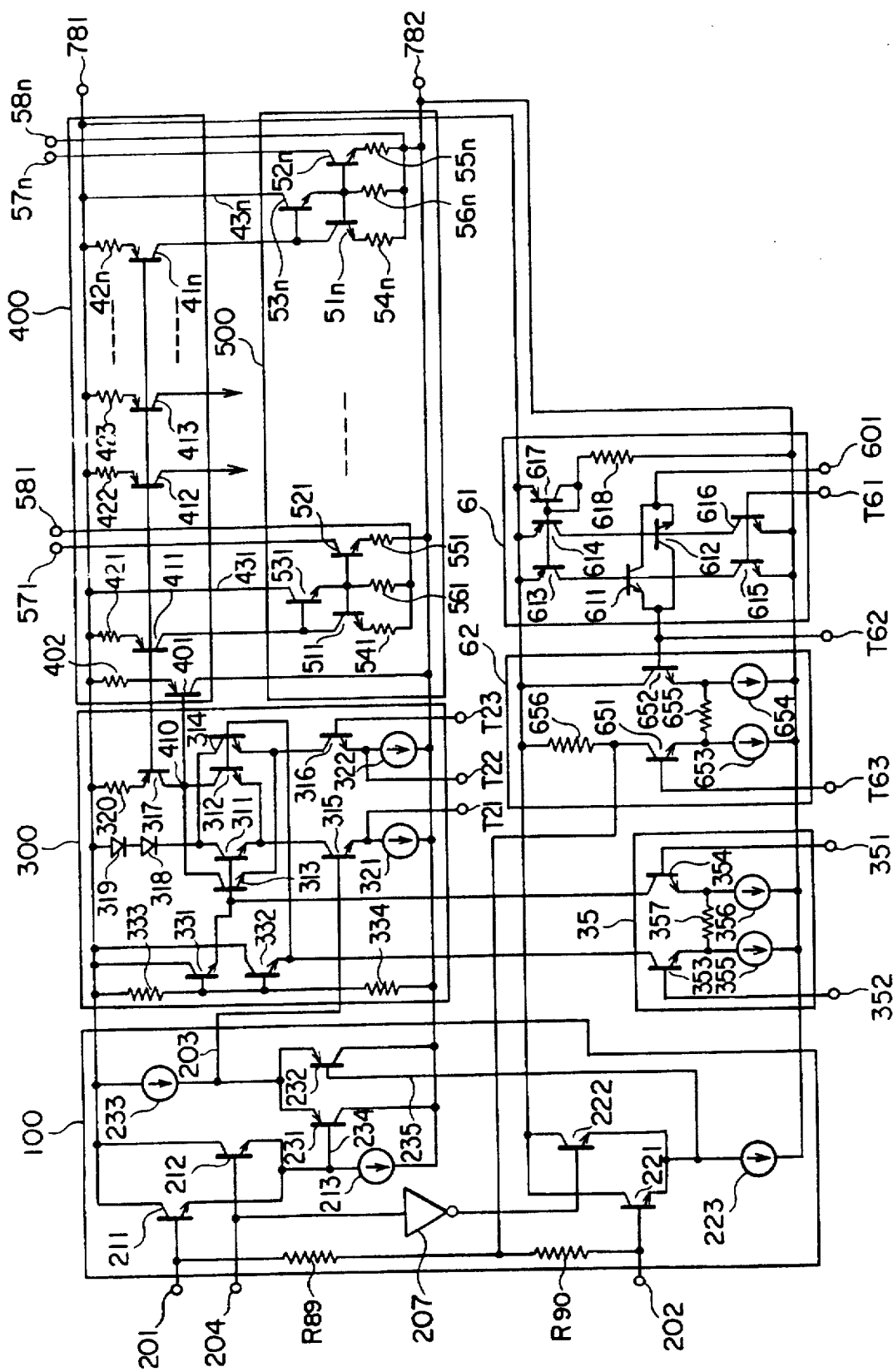
FIG. 20 is a detailed circuit diagram of an IC section shown in FIG. 19.

Respective output terminals of a plurality of current mirror amplifiers 501–50$n$ are disposed alternately with respective ground terminals. Outside the chip 80, they are collected respectively to form one output terminal and one ground terminal. The collected output line of the current mirror amplifiers 501–50$n$ is connected to the emitter of the high-frequency power transistor 71. Forward bias power supply 762 outputting approximately several V is connected to the base of the power transistor 71. High-voltage power supply 761 for output is connected to the collector of the power transistor 71 via a load resistor $R_L$. That is to say, the IC 80 and the power transistor 71 form a cascade amplifier of current-drive and voltage-output type. The collector output of the power transistor 71 is led to the cathode of the CRT via a fixed cathode bias power supply (not illustrated). In addition, the collector output of the power transistor 71 is supplied to a sampling input terminal 601 of the video IC 80 via feedback resistors 771 and 772 for defining the DC operation point. This signal is supplied to the input side of the amplifier via the sampling switch 61, the hold capacitor $C_{X2}$, the amplifier 62, and high-resistance resistors R89 and R90 to attain negative feedback. An input terminal T63 of the amplifier 62 is supplied with such reference voltage that the high-voltage output of the amplifier becomes a desired value. An analog video interface signal as illustrated is supplied to an input terminal 202 of this video IC 80 via an AC coupling capacitor $C_{X1}$. This signal voltage is typically generated by a video memory and a D-A converter (neither of them are generated) and has an amplitude of 1 V or less. Since approximately 40 V is necessary as the contrast signal voltage for driving cathode electrode in a high definition CRT, a voltage amplifier of inversion type having a maximum gain of approximately 100 is formed as the video amplifier. Impedance comprising a resistor and a series connection of a resistor and a capacitor connected between external terminals T21 and T22 of the video gain controller is the voltage-current conversion impedance of the video gain controller. Assuming now that this impedance is $Z_x$ and the load resistor $R_L$ has a resistance value $R_L$, therefore, the output $V_o$ of the video amplifier shown in FIG. 19 has relationship represented by equation (1) with respect to the input $V_i$ in the same way as the embodiment shown in FIG. 1. FIG. 20 is a circuit diagram showing details of FIG. 19.

As shown in FIG. 19, the circuit of the embodiment is so configured that current output terminals 571–57$n$ of the video IC 80 may be paired with ground terminals 581–58$n$. As shown in the detailed circuit diagram of FIG. 20, respective ground terminals are connected to a common ground terminal 782 for every output circuit. By doing so, the output current does not flow to a common line, but, instead flows to each ground line. In conjunction with the effect of the current signal interface described before, this mitigates the influence of impedance drop caused by the output current and contributes to the wideband, low-noise operation.

Another feature of the IC output stage seen from this viewpoint is shown in the package terminal arrangement diagram of FIG. 21A. As shown in FIG. 21A, output terminals (Oi) and ground terminals (Gi) of respective current amplifiers are disposed adjacently and alternately. The current flowing through each output terminal and the current flowing through each ground terminal are opposite in polarity and equal in magnitude. In a package having dense terminals and nearly equal terminal lengths as shown in FIG. 21A, therefore, the mutual inductance effect acts between each output terminal and each ground terminal. As a result, the effective lead inductance of each terminal largely decreases.

Therefore, the unstable feedback effect caused by a change in ground potential in the IC can be excluded, and wideband signals can be outputted. Further, since induction of current flowing through output leads cancel each other, noises generated by external leads can be largely reduced, external disturbance being prevented.

Because of the provision of the split current output stage, the present embodiment can cope with various high-voltage output stages corresponding to high-speed operation.

Figure 21B:
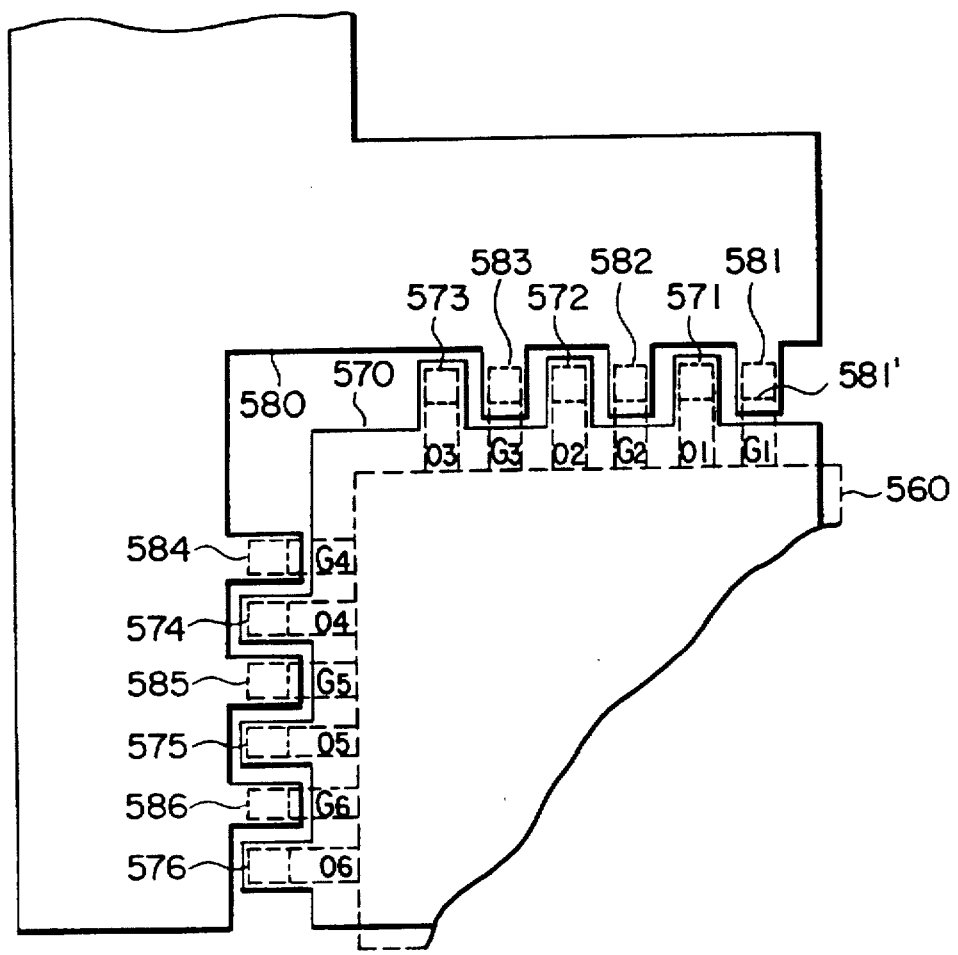
Figure 25:
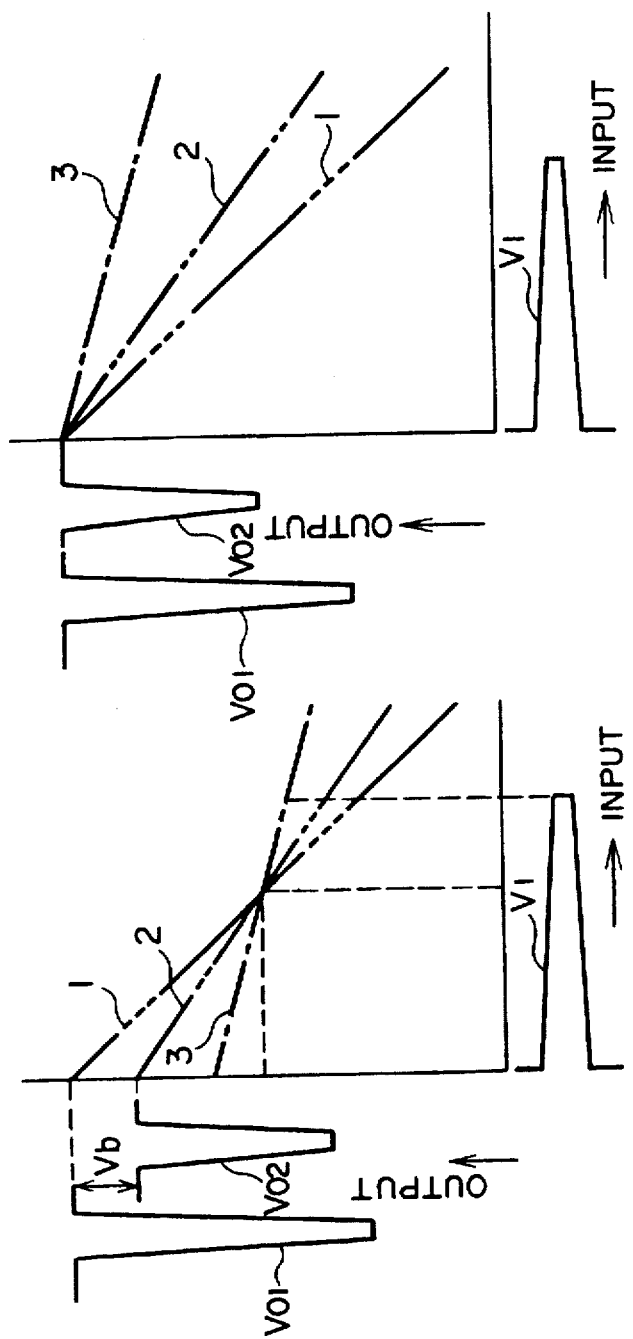
FIGS. 25A and 25B are diagrams for describing the characteristics of a gain controller according to the present invention.

When the multiple-split-output IC package as shown in FIG. 21A is to be formed on a printed-circuit board, an arrangement corresponding to the reduction of lead inductance by multiple split outputs is effective to the conductor pattern arrangement on the printed-circuit board side. FIG. 21B shows an embodiment of such conductor pattern arrangement on the printed-circuit board side.

In FIG. 21B, solid lines indicate conductor patterns on the printed-circuit board and broken lines indicate IC packages including leads. That is to say, an output conductor pattern 570 collecting output leads 576–576 of the IC package and a ground conductor pattern collecting ground leads 581 to 586 engage and oppose each other like comb teeth. As represented by 581', each lead electrode of the IC package is bent beforehand so that the front end may become parallel to the conductor pattern. The bent portion of the lead is laid on a comb tooth of the above described conductor pattern and joined electrically thereto by solder or the like. Further, the output conductor pattern of the inside is led to the read face via a plurality of through-hole conductors (not illustrated) to form low-impedance balanced wiring in conjunction with the ground conductor pattern. Such an in-line comb electrode is an embodiment suitable to short the lead length of the package and balance the effective lengths.

FIGS. 22 to 24 show other embodiments of the output stage.

In FIG. 22, the cascade amplifier already described comprises a series connection of one amplifier 501 included in a large number of current output amplifiers 500 and a circuit including a transistor 71 and a resistor $R_L$. Buffer amplifiers are driven by remaining current output amplifiers 502–50n. That is to say, a power transistor 751 serves as an emitter follower, whereas a power transistor 752 serves as a constant current bias source for the emitter follower. In such configuration shown in FIG. 22, the output impedance is lowered by the emitter follower without increasing the total dissipated current. The load capacity can thus be driven at high speed.

FIG. 23 shows an embodiment of an output stage configuration using the present invention. In the embodiment of FIG. 23, current amplifiers 502–50n, a power transistor 71 and a load resistor $R_L$ form a cascade amplifier. A pulse transformer 765 disposed at the input side of the cascade amplifier is driven by a current amplifier 501. The pulse transformer 765 has a capacitor 767 for differentiation on its secondary side and forms a differentiation circuit in conjunction with the pulse transformer. Numeral 764 denotes a circuit damping resistor. This differentiation has such a polarity as to accelerate the change. That is to say, with respect to a change in such a direction as to increase the current of each current amplifier, the pulse transformer generates a positive voltage pulse having an illustrated polarity to make the base voltage of the transistor 71 positive and accelerate the current flowing through the transistor 71. Even for a direction in which the current decreases, the decrease is accelerated by the same reason. Therefore, the passband of the final-stage amplifier can be made wider.

FIG. 24 shows another embodiment of an output stage configuration according to the present invention. In FIG. 24, a pulse transformer 765 is inserted between the power transistor 71 of the cascade amplifier and the load resistor $R_L$, and the primary side of the pulse transformer is driven by the current amplifier 501. The drive polarity in this case is so selected as to promote the change of the collector voltage of the transistor 71. BY doing so, the differential gain is increased and the wideband amplifier can be realized. Since such a method is a kind of peaking, inductance of the pulse transformer must be so selected in a suitable range depending upon the transistor to be used and the load capacity that an effect may be brought about in a range of decreasing bandwidth.

Through the embodiments of FIGS. 22 to 24, it has been described that the present invention can cope with various high-voltage output stages and their broadened bandwidth. These indicate only examples and further more versions are possible. Such diversity can be coped with because the output stage of the IC section is formed as a plurality of split open-collector current output transistors. That is to say, various output forms become possible because the output stage according to the present invention comprising a plurality of divisions can drive a plurality of loads without mutual interference.

In application, complementary pair circuits in another embodiment of the present invention can demonstrate many favorable characteristics. One of them is that interference of the contrast signal and the brightness signal is eliminated when the gain of the CRT video amplifier is adjusted. The quadruple quadrant multiplier used for the gain control of a video amplifier has 0 as the center value (balance state) of its input-output characteristic. However, the video amplifier output has bias because it has a single polarity. If the gain is so changed between gain 1 and gain 2 with respect to the input $V_i$ that the output waveform may change from $V_{o1}$ to $V_{o2}$ as shown in the input-output characteristic diagram of FIG. 25A, therefore, the reference level of the output waveform changes by $V_b$ as illustrated. It is undesirable to change the contrast gain in this way because the brightness level also changes. If the operation range is limited to half (i.e., if the input is limited to the right side of a broken line shown in FIG. 25A), the variation can be removed. However, it is disadvantageous because the dynamic range is halved.

Figure 26:
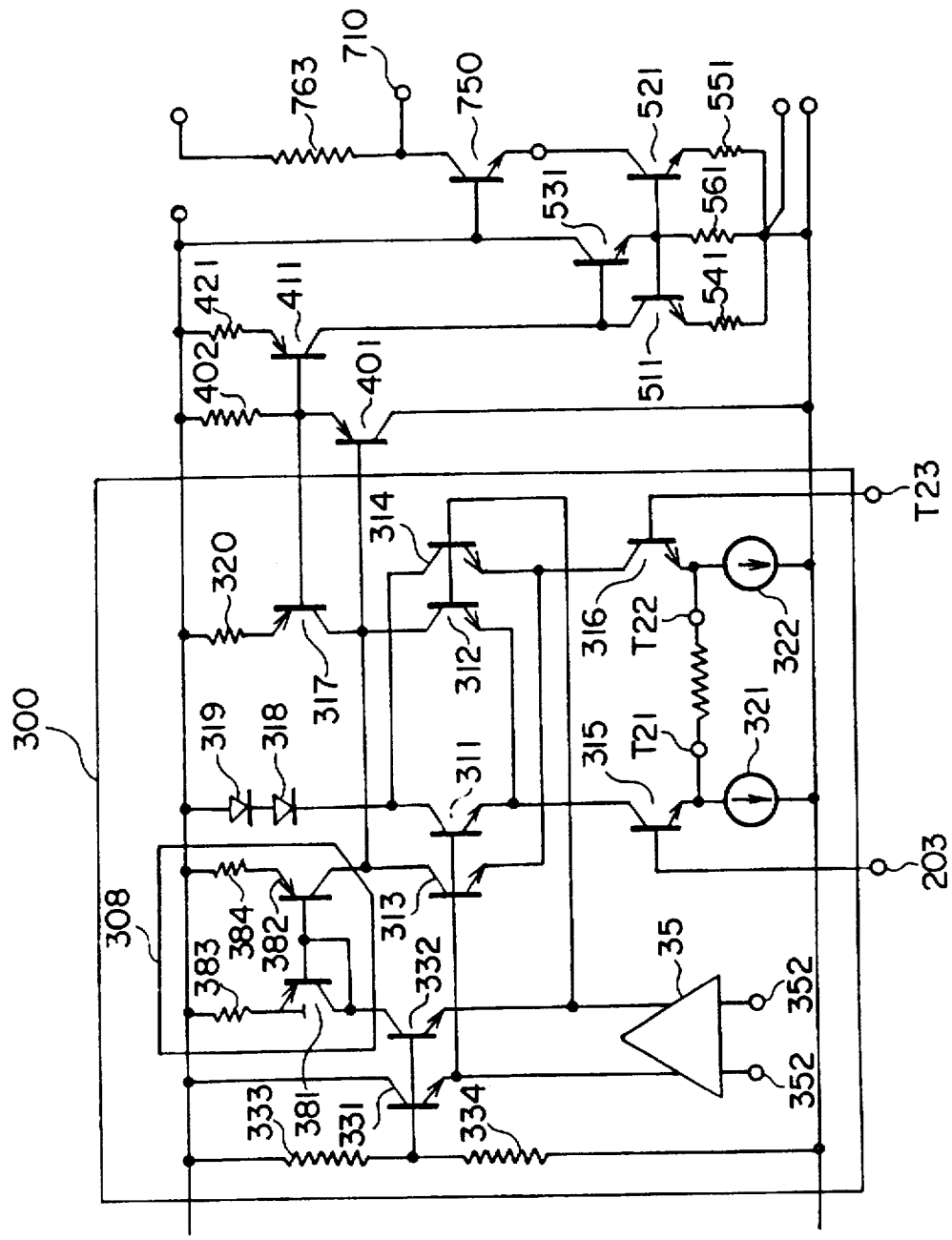
FIGS. 26 and 27 are circuit diagrams showing other embodiments of the gain controller.

In accordance with the present invention, therefore, a circuit for generating a bias proportionate to the gain as shown in FIG. 26 is used. With reference to FIG. 26, a variable bias circuit 308 is provided in the circuit of the video gain controller 300. The bias circuit 308 is a current mirror circuit comprising PNP transistors 381 and 382. The transistor 381 of the input side is inserted in series with a transistor 332, and the transistor 382 of the output side is inserted in parallel with the gain controller output. By doing so, a current of variable gain can be generated in the variable bias circuit 308. The output of the gain controller 300 is thus biased according to the gain, resulting in characteristics as shown in FIG. 25B. That is to say, even if the gain is changed as 1, 2, . . . , the amount of bias correction is also changed correspondingly. As represented by $V_{o1}$ and $v_{o2}$, therefore, the output does not change in reference level and is stable. Operation in wide input and output dynamic ranges thus becomes possible.

Figure 27:
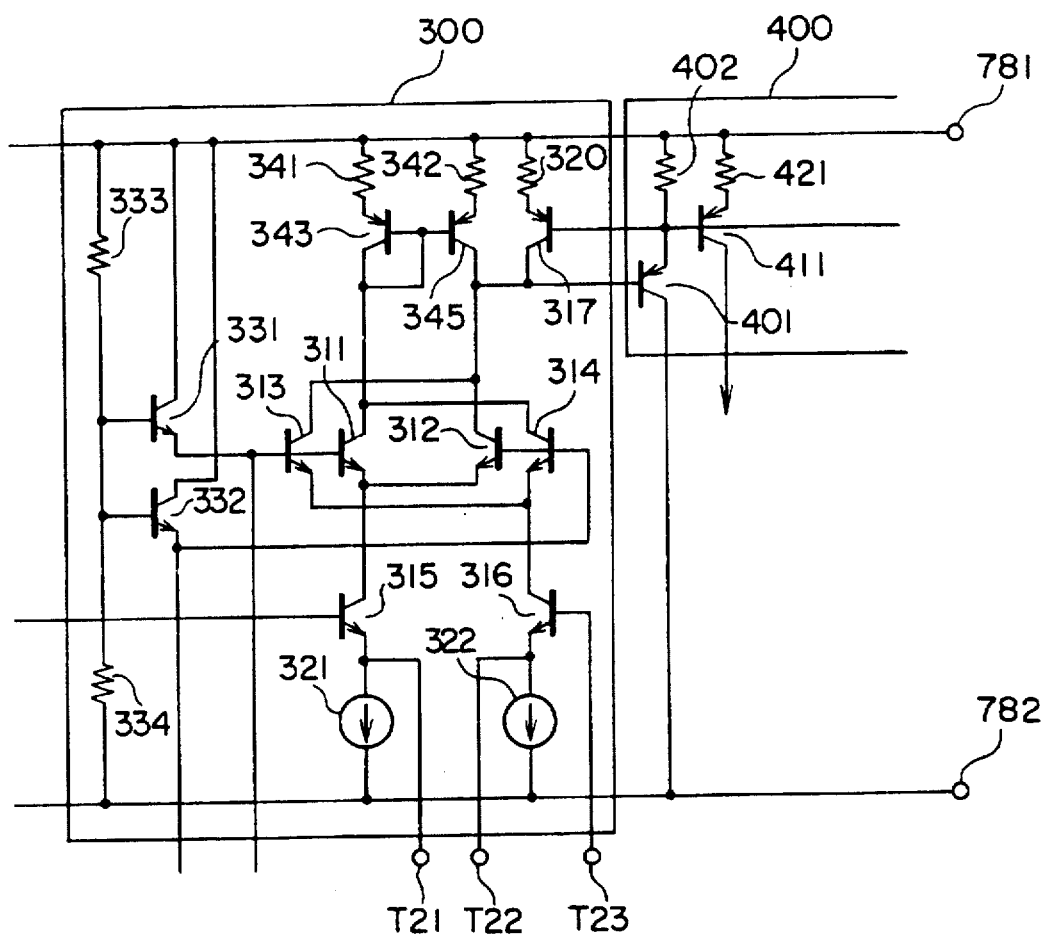
Figure 28:
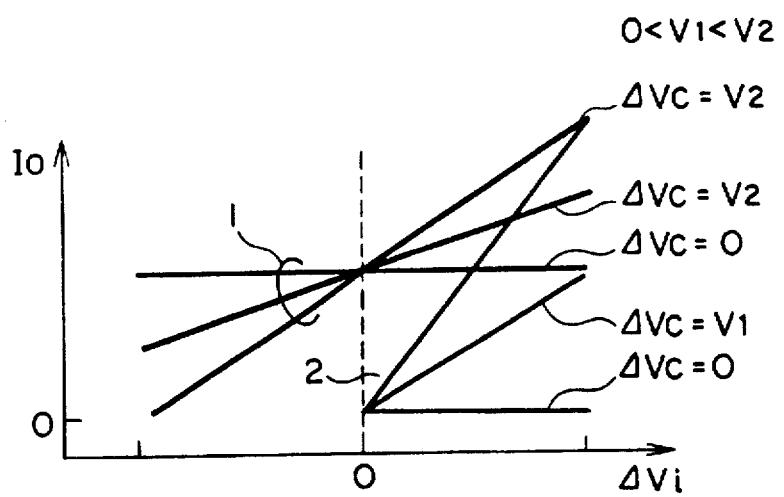
FIG. 28 is a diagram for describing the characteristics of the gain controller shown in FIG. 27.

FIG. 27 shows another embodiment of the present invention. With reference to FIG. 27, the current output of the gain controller 300 is converted into a differential signal by a current differential circuit comprising PNP transistors 343 and 345, and the differential current is permitted to flow through a reference transistor 317 of a current mirror circuit. A signal current $I_o$ is thus obtained from an output transistor 411. This differential output characteristic is represented by characteristic 2 shown in FIG. 28. In FIG. 28, the abscissa represents input signal voltage $\Delta V_i$ and the ordinate represents output current $I_o$. When the gain control voltage of the gain controller 300 used as the parameter is defined as $\Delta V_c=0$, $V_1$ and $V_2$, single-end characteristic 1 is shown in comparison with the differential characteristic 2. In the differential characteristic, the operation range of $\Delta V_i$ is halved, but the gain is doubled and the output current at $\Delta V_c=0$ (gain is 0) becomes 0. If that state is associated with the black level of the video signal, therefore, the object as shown in FIG. 26, i.e., prevention of a change of reference operation point when the gain changes, can be attained.

Current operation and the complementary transistor circuit adopted in the present invention facilitate the above described operation of FIGS. 26 and 27.

Finally, a variant of a video amplifier of indirect feedback type will now be described. The signal may be negatively fed back indirectly from a section having voltage lower than the output voltage of the video amplifier (i.e., high voltage applied to the cathode of the CRT display). Various embodiments other than those disclosed in FIGS. 7 and 8 are conceivable.

Figure 29:
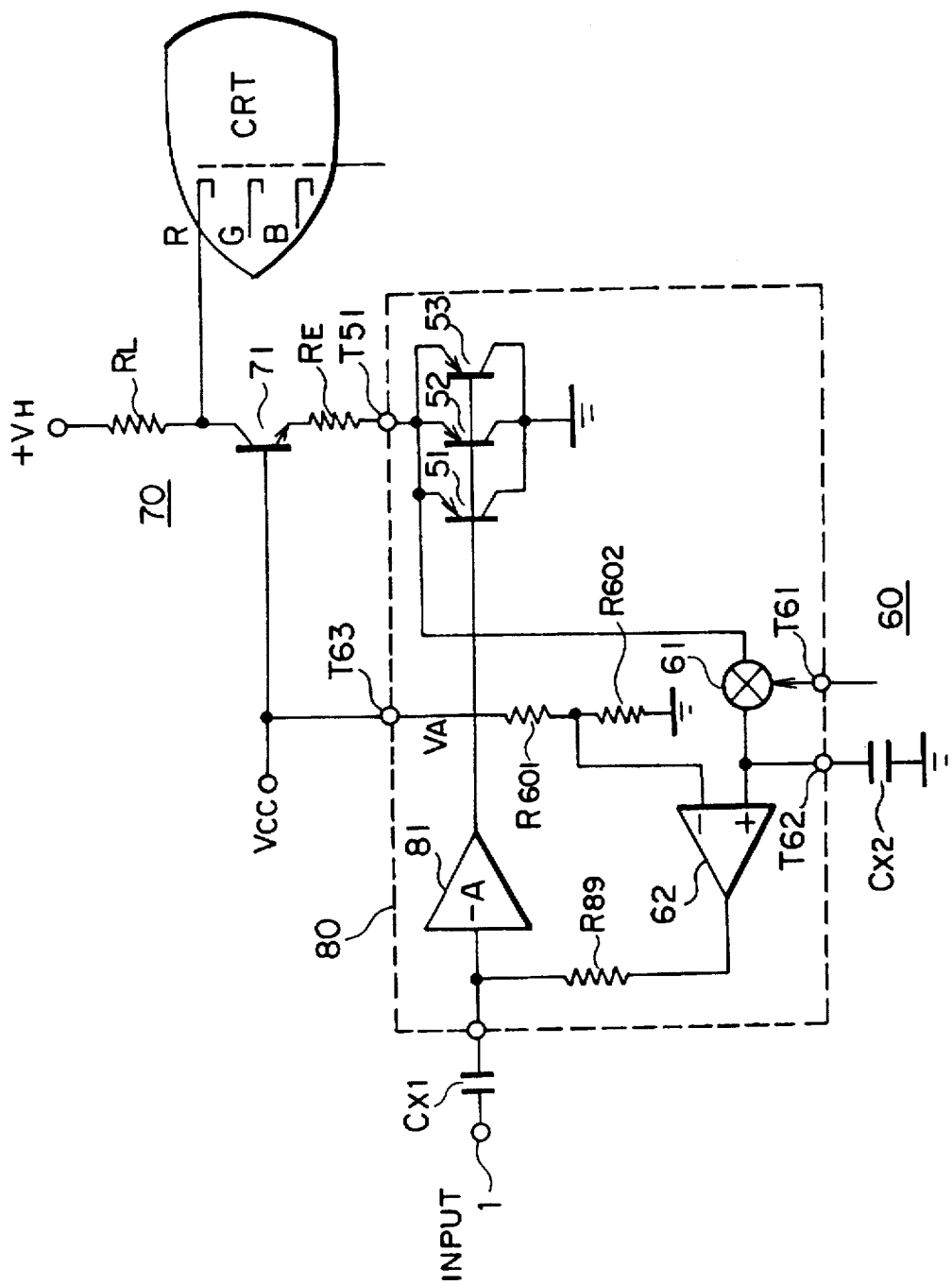
FIGS. 29, 30 and 31 are diagrams showing other embodiments of the video amplifier of indirect feedback type.
Figure 30:
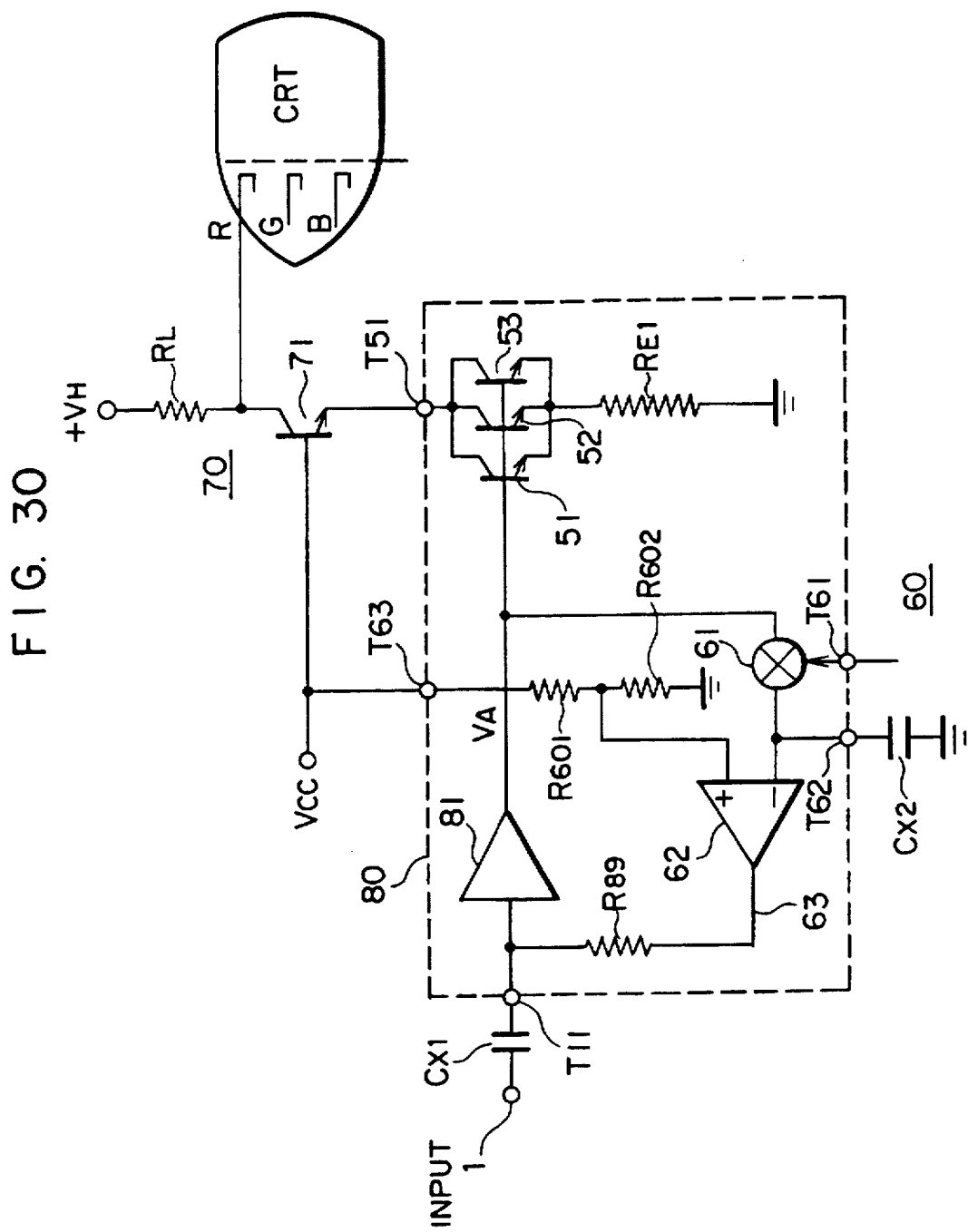

Other embodiments shown in FIGS. 29 and 30 are based upon the embodiment of FIG. 7. The embodiment of FIG. 29 differs from the embodiment of FIG. 7 in that an inverting amplifier is used as the preamplifier 81 and the transistors 51, 52 and 53 of the low-voltage section are replaced by PNP transistors, and in that an emitter resistor $R_E$ is connected on the emitter side of the transistors 51, 52 and 53 to form an emitter follower. Further, the voltage fed back to the sample-and-hold circuit 60 is taken out from the terminal T51.

Assuming now in FIG. 29 that the emitter-base voltage of the transistors 71, 51, 52 and 53 is $V_{BE}$ and the output voltage of the amplifier 81 is $V_A$, the described DC bias output $V_o$ of the high-voltage output stage and the voltage $V_F$ fed back to the sample-and-hold circuit 60 are represented by the following equations.

$$V_o = V_H - \frac{R_L}{R_E}(V_{cc} - V_A - 2V_{BE}) \quad (14)$$

$$V_F = V_A + V_{BE} \quad (15)$$

From the equations (14) and (15), we get the following equation.

$$\frac{R_E}{R_L} = \frac{V_{cc} - V_F}{V_H - V_o} = \frac{V_{cc}(1-k)}{V_H - V_o} \quad (16)$$

The relation similar to that of the equation (7) is thus obtained. By using only the circuit of the low-voltage section, therefore, bias control of the output and voltage becomes possible.

Further, another embodiment of the video amplifier of indirect feedback type is shown in FIG. 30. In the embodiment shown in FIG. 30, the feedback voltage to be inputted to the sample-and-hold circuit 60 is taken from the output of the preamplifier 81, i.e., the intermediate stage of the low-voltage circuit section. In this case as well, the relation similar to that of the equation (7) is obtained. By using the circuit of the low-voltage section alone, therefore, bias control of the output and voltage becomes possible.

Figure 31:
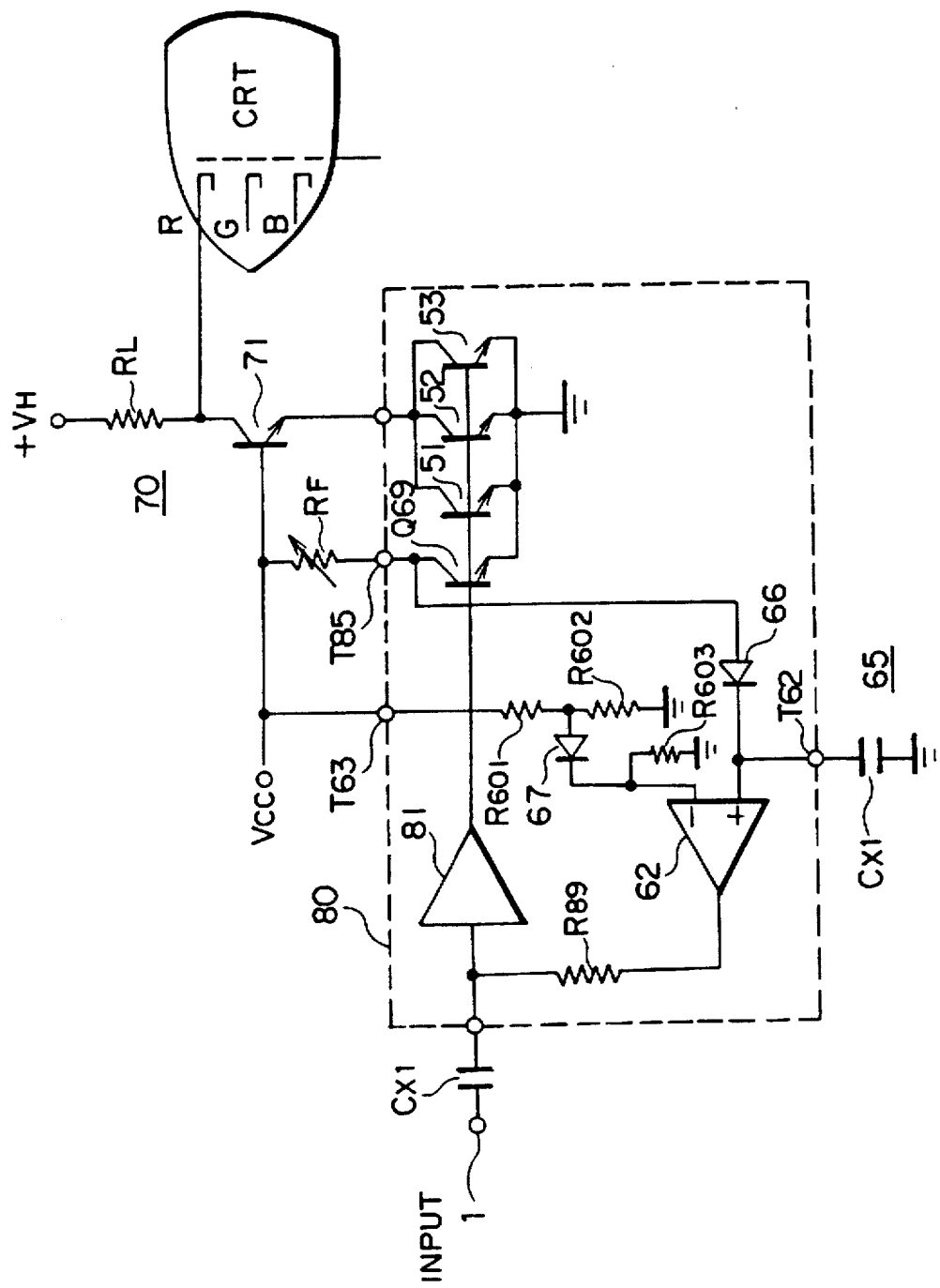

FIG. 31 shows another embodiment of the video amplifier of indirect feedback type based upon the circuit of FIG. 8. The embodiment of FIG. 31 differs from the embodiment of FIG. 8 in that a peak hold circuit 65 is used instead of the sample-and-hold circuit of FIG. 8. This peak hold circuit 65 comprises diodes 66 and 67, resistors R601–R603, a capacitor $C_x$, and an amplifier 62. The peak value of voltage generated at a terminal T85 is held by the diode 66 and the capacitor $C_x$. (The polarity of voltage generated at the terminal T85 is the same as that of the output.) Thereby, the voltage corresponding to the back porch level of the video signal can be obtained without using the timing signal as shown in FIG. 8. An effect similar to that of FIG. 8 is obtained. The circuit comprising the diode 67 and the resistor R603 functions to adjust the input operation point of the amplifier 62.

In the foregoing description of various embodiments of the present invention, bipolar transistors are used. However, complementary JFETs or the like may also be used. Further, vertical PNP transistors or lateral PNP transistors may also be used as high-frequency PNP transistors as the occasion may demand.

As an application of complementary transistor circuits according to the present invention, wide application using amplifiers such as a laser driver handling high frequency, an ultrasonic driver, a line driver, a pulse amplifier, a current output transmitter, and a constant current output circuit can be considered.

(1) Owing to the present invention, the equivalent load of the output side of the amplifier can be lightened, and the greater part of the circuits operate in the current mode. High-speed, wideband operation thus becomes possible. More specifically, the video amplifier has a bandwidth of 250 to 300 MHz, and a high-definition CRT display having 5M pixels or more can be realized. Bandwidth of 500 MHz is realized for the IC driver alone.

(2) Since the present invention allows operation using current signals, signal dynamic range can be made large and high precision is attained. Owing to the present invention, precision of ±0.5% or less can be easily attained in the required signal range.

(3) For the above described reasons, operation with low-voltage power supply and lower power dissipation can be achieved, and integration becomes easy.

(4) Owing to the present invention, the circuit becomes small-sized and simple, resulting in reduced cost and improved reliability.

(5) In the present invention, the circuit operates with current signals. Therefore, the circuit is not affected by a change in ground potential, and the signal-to-noise ratio can be improved.

(6) For the same reason, addition, subtraction and level shift of signals become easy, and new functions can be easily coped with.

(7) Owing to the division of the output stage according to the present invention, the effective lead inductance of the terminals can be made small, and the bandwidth of the high-voltage output stage can be easily widened.

We claim:

1. A complementary transistor circuit comprising:
   a multiplier circuit including a plurality of differential transistor pairs, collectors of said plurality of differential transistor pairs of said multiplier circuit being cross-coupled, and said differential transistor pairs having a common emitter connection;
   a linearizing bias circuit including transistors connected to respective bases of said plurality of differential transistor pairs, a voltage-current converter circuit, and a resistive voltage divider circuit;
   a voltage-current converter circuit including transistors connected to the common emitter of said plurality of differential transistor pairs, resistors and a constant current circuit;
   diodes connected to one of collectors of said plurality of differential transistor pairs; and
   a current mirror circuit, performing gain control of an input signal, including transistors connected to the other of collectors of said plurality of differential transistor pairs, said transistors having a polarity complementary to the polarity of said plurality of differential transistor pairs.

2. A complementary transistor circuit according to claim 1, wherein an current of the load side is so controlled as to be in proportion to a voltage between control input terminals connected to said voltage-current converter circuit of said linearizing bias circuit.

3. An amplifier, provided as a single-chip IC, comprising at least one of
   (a) a multiplexer for selecting and outputting an input signal by using complementary differential transistor pairs;

(b) a gain controller for controlling the gain with respect to an input signal, said gain controller including a multiplier circuit comprising a plurality of differential transistor pairs, and a first current mirror circuit comprising transistors having a polarity complementary to that of said plurality of differential transistor pairs; and (c) a second current mirror circuit for performing current amplification and supplying an output signal, said second current mirror circuit comprising transistors having a polarity complementary to that of said first current mirror circuit, wherein said gain controller changes the gain by using a resistor and a series connection of a resistor and a capacitor connected between external terminals of said single-chip IC.

4. An amplifier comprising at least one of (a) a multiplexer for selecting and outputting an input signal by using complementary differential transistor pairs;

(b) a gain controller for controlling the gain with respect to an input signal, said gain controller including a multiplier circuit comprising a plurality of differential transistor pairs, and a first current mirror circuit comprising transistors having a polarity complementary to that of said plurality of differential transistor pairs; and (c) a second current mirror circuit for performing current amplification and supplying an output signal, said second current mirror circuit comprising transistors having a polarity complementary to that of said first current mirror circuit, wherein said amplifier includes both NPN transistors and PNP transistors as transistor pairs and said amplifier is configured as a current operation type.

5. An amplifier comprising at least one of (a) a multiplexer for selecting and outputting an input signal by using complementary differential transistor pairs;

(b) a gain controller for controlling the gain with respect to an input signal, said gain controller including a multiplier circuit comprising a plurality of differential transistor pairs, and a first current mirror circuit comprising transistors having a polarity complementary to that of said plurality of differential transistor pairs; and (c) a second current mirror circuit for performing current amplification and supplying an output signal, said second current mirror circuit comprising transistors having a polarity complementary to that of said first current mirror circuit, wherein said multiplexer comprises:

first and second differential switches each including a pair of differential-connected bipolar transistors having a first conductivity type and a resistor or a constant current source connected to a common emitter of said pair of differential-connected transistors;

a differential circuit including first and second bipolar transistors having a second conductivity type, complementary to said first conductivity type, and having mutually connected emitters and collectors, and a third bipolar transistor having the second conductivity type connected to a common emitter of said first and second bipolar transistors directly or via a resistor; and a fourth bipolar transistor having the first conductivity type and having a resistor or a constant current source connected to the emitter thereof;

said first differential switch being supplied with a first input signal at one of differential inputs thereof and being supplied with a first control signal at the other of differential inputs thereof;

said second differential switch being supplied with a second input signal at one of differential inputs thereof and being supplied with a second control signal at the other of differential inputs thereof;

said first bipolar transistor having a base connected to said common emitter of said first differential switch;

said second bipolar transistor having a base connected to said common emitter of said second differential switch;

said fourth bipolar transistor having a base supplied with reference voltage; and said third bipolar transistor having a base connected to the emitter of said fourth transistor.

6. An amplifier comprising at least a gain controller, for controlling the gain with respect to an input signal, including a current mirror arrangement, said current mirror arrangement comprising:

a multiplier circuit comprised of a plurality of differential transistor pairs, collectors of said plurality of differential transistor pairs being cross-coupled, and said differential transistor pairs having a common emitter connection;

a linearizing bias circuit including transistors connected to respective bases of said plurality of differential transistor pairs, a voltage-current converter circuit, and a resistive voltage divider circuit;

a voltage-current converter circuit including transistors connected to the common emitter of said plurality of differential transistor pairs, resistors and a constant current circuit;

diodes connected to one of collectors of said plurality of differential transistor pairs; and a current mirror circuit including transistors connected to the other of collectors of said plurality of differential transistor pairs, said transistors having a polarity complementary to the polarity of said plurality of differential transistor pairs.

7. An amplifier comprising:

(a) a multiplexer for selecting and outputting an input signal by using complementary differential transistor pairs;

(b) a gain controller for controlling the gain with respect to an input signal, said gain controller including a multiplier circuit comprising a plurality of differential transistor pairs, and a first current mirror circuit for performing current amplification including transistors having a first polarity, complementary to that of said plurality of differential transistor pairs; and (c) a second current mirror circuit for performing current amplification and supplying an output signal, said second current mirror circuit including transistors having a second polarity, complementary to said first polarity.

8. An amplifier according to claim 5, wherein said first conductivity type is NPN type conductivity and said second conductivity type is PNP type conductivity.

9. An amplifier according to claim 5, wherein said first conductivity type is PNP type conductivity and said second conductivity type is NPN type conductivity.

10. An amplifier, provided on a semiconductor chip, comprising:

a multiplexer for selecting and outputting an input signal by using complementary differential transistor pairs;

a gain controller for controlling the gain with respect to an input signal, said gain controller including a multiplier circuit comprising a plurality of differential transistor pairs, and a first current mirror circuit comprising transistors having a polarity complementary to that of said plurality of differential transistor pairs; and a second current mirror circuit for performing current amplification and supplying an output signal, said second current mirror circuit comprising transistors having a polarity complementary to that of said first current mirror circuit, wherein said gain controller changes the gain by using a resistor and a series connection of a resistor and a capacitor connected between external terminals of said semiconductor chip.

11. A gain controller comprising:

a first differential transistor pair and a second differential transistor pair, collectors of said first and second differential pairs being cross-coupled;

a first voltage-current converter circuit connected to bases of said first and second differential transistor pairs;

a second voltage-current converter circuit connected to common emitters of said first and second differential transistor pairs; and a current mirror circuit having a pair of transistors, an input side of said current mirror circuit being connected to an output of said first voltage-current converter circuit through a transistor and an output side of said current mirror circuit being connected to a collector terminal commonly coupling the collector of a transistor of one of the two differential transistor pairs and the collector of a transistor of the other one of the two differential transistor pairs.

12. A gain controller according to claim 11, wherein the transistors of said first and second differential transistor pairs and the transistor connecting an output of said first voltage-current converter circuit to the input side of said current mirror circuit have a first type conductivity, respectively, and wherein the transistors of said current mirror circuit have a second type conductivity, complementary to said first type conductivity, respectively.

13. A gain controller comprising:

a first differential transistor pair and a second differential transistor pair, collectors of said first and second differential transistor pairs being cross-coupled;

a voltage-current converter circuit for controlling an input to said first and second differential transistor pairs;

a logarithm control voltage generating circuit provided at a control input side of said first and second differential transistor pairs; and a bias circuit for generating a bias signal in accordance with a control input signal so that a DC bias of an output of said gain controller is maintained constant even when a control gain of said gain controller changes.

14. A gain controller according to claim 13, wherein said bias circuit is comprised of a current mirror circuit.

* * * * *